(12) United States Patent
Todd

(10) Patent No.: US 7,425,350 B2
(45) Date of Patent: Sep. 16, 2008

(54) APPARATUS, PRECURSORS AND DEPOSITION METHODS FOR SILICON-CONTAINING MATERIALS

(75) Inventor: Michael A. Todd, Phoenix, AZ (US)

(73) Assignee: ASM Japan K.K., Tokyo (JP)

( * ) Notice: Subject to any disclaimer, the term of this patent is extended or adjusted under 35 U.S.C. 154(b) by 338 days.

(21) Appl. No.: 11/117,988

(22) Filed: Apr. 29, 2005

(65) Prior Publication Data

US 2006/0247404 A1  Nov. 2, 2006

(51) Int. Cl.
B05D 3/02 (2006.01)
C23C 16/40 (2006.01)
C23C 16/56 (2006.01)

(52) U.S. Cl. .................. 427/372.2; 427/96.1; 427/97.6; 427/255.18; 427/255.28; 427/255.37; 427/373

(58) Field of Classification Search ........................ None
See application file for complete search history.

(56) References Cited

U.S. PATENT DOCUMENTS

| | | | |
|---|---|---|---|
| 3,342,754 A | 9/1967 | Gorham | |
| 5,268,202 A | 12/1993 | You et al. | |
| 5,331,504 A | 7/1994 | Kamiya et al. | |
| 5,470,802 A | 11/1995 | Gnade et al. | |
| 5,561,318 A * | 10/1996 | Gnade et al. | 257/638 |
| 5,569,058 A | 10/1996 | Gnade et al. | |
| 5,700,844 A | 12/1997 | Hedrick et al. | |
| 5,744,378 A | 4/1998 | Homma | |
| 5,776,990 A | 7/1998 | Hedrick et al. | |
| 5,800,877 A | 9/1998 | Maeda et al. | |
| 5,847,443 A | 12/1998 | Cho et al. | |
| 6,022,812 A | 2/2000 | Smith et al. | |
| 6,045,877 A | 4/2000 | Gleason et al. | |
| 6,048,804 A | 4/2000 | Smith et al. | |
| 6,051,321 A | 4/2000 | Lee et al. | |
| 6,171,945 B1 | 1/2001 | Mandal et al. | |
| 6,208,014 B1 | 3/2001 | Wu et al. | |
| 6,261,469 B1 | 7/2001 | Zakhidov et al. | |
| 6,316,055 B1 | 11/2001 | Desu et al. | |
| 6,316,063 B1 | 11/2001 | Andideh et al. | |
| 6,331,493 B1 | 12/2001 | Sharan | |
| 6,335,296 B1 | 1/2002 | Hendricks et al. | |
| 6,358,863 B1 | 3/2002 | Desu et al. | |
| 6,372,666 B1 | 4/2002 | Ramos et al. | |
| 6,472,079 B2 | 10/2002 | Hayashi et al. | |
| 6,495,208 B1 | 12/2002 | Desu et al. | |
| 6,500,773 B1 | 12/2002 | Gaillard et al. | |
| 6,506,627 B1 | 1/2003 | Murakamz et al. | |
| 6,534,616 B2 | 3/2003 | Lee et al. | |
| 6,541,865 B2 | 4/2003 | Hawker et al. | |
| 6,582,777 B1 | 6/2003 | Ross et al. | |
| 6,583,048 B1 | 6/2003 | Vincent et al. | |
| 6,593,251 B2 | 7/2003 | Baklanov et al. | |
| 6,596,404 B1 | 7/2003 | Albaugh et al. | |
| 6,596,627 B2 | 7/2003 | Mandal | |
| 6,602,804 B2 | 8/2003 | Allen et al. | |
| 6,642,157 B2 | 11/2003 | Shioya et al. | |
| 6,797,343 B2 | 9/2004 | Lee | |
| 6,825,130 B2 | 11/2004 | Todd | |
| 6,869,638 B2 | 3/2005 | Baum et al. | |
| 6,890,605 B2 | 5/2005 | Nishikawa | |
| 6,905,981 B1 | 6/2005 | Todd et al. | |
| 2002/0175393 A1 | 11/2002 | Baum et al. | |
| 2002/0180028 A1 | 12/2002 | Borovik et al. | |
| 2003/0051662 A1 | 3/2003 | Lee et al. | |
| 2003/0064154 A1 | 4/2003 | Laxman | |
| 2003/0100691 A1 | 5/2003 | Lee et al. | |
| 2004/0048960 A1 | 3/2004 | Peterson et al. | |
| 2004/0052948 A1 | 3/2004 | Gronbeck et al. | |
| 2004/0121139 A1 | 6/2004 | Yim et al. | |
| 2004/0175957 A1 * | 9/2004 | Lukas et al. | 438/778 |
| 2004/0188846 A1 | 9/2004 | Hamada | |
| 2004/0195660 A1 | 10/2004 | Hamada et al. | |
| 2004/0241463 A1 * | 12/2004 | Vincent et al. | 428/447 |

FOREIGN PATENT DOCUMENTS

| | | |
|---|---|---|
| EP | 1006566 | 1/2001 |
| EP | 1245628 | 10/2002 |
| JP | 2001189311 | 7/2001 |

(Continued)

OTHER PUBLICATIONS

Char, Kookheon et al, "Material Issues for Nanoporous Ultra Low-k Dielectrics,".

(Continued)

Primary Examiner—Marc S. Zimmer
(74) Attorney, Agent, or Firm—Knobbe, Martens, Olson & Bear, LLP

(57) ABSTRACT

A method for making a Si-containing material comprises transporting a pyrolyzed Si-precursor to a substrate and polymerizing the pyrolyzed Si-precursor on the substrate to form a Si-containing film. Polymerization of the pyrolyzed Si-precursor may be carried out in the presence of a porogen to thereby form a porogen-containing Si-containing film. The porogen may be removed from the porogen-containing Si-containing film to thereby form a porous Si-containing film. Preferred porous Si-containing films have low dielectric constants and thus are suitable for various low-k applications such as in microelectronics and microelectromechanical systems.

62 Claims, 10 Drawing Sheets

FOREIGN PATENT DOCUMENTS

| | | |
|---|---|---|
| JP | 2001237241 | 8/2001 |
| JP | 2002030248 | 1/2002 |
| JP | 2002030249 | 1/2002 |
| JP | 2003163210 | 6/2003 |
| JP | 2004256479 | 9/2004 |
| WO | WO 0136703 | 5/2001 |
| WO | WO 2004090936 | 10/2004 |

OTHER PUBLICATIONS

Dixit, Girish et al., "Film Properties and Integration Performance of a Nano-Porous Carbon Doped Oxide,".

Fayolle, M. et al., "Cu/ULK integration using a post integration porogen removal approach,".

Hrubesh, L., Mat. Res. Soc. Symp. Proc. vol. 381 p. 267 (1995).

Kawahara, J. et al., "A New Plasma-Enhanced Co-Polymerization (PCP) Technology for Reinforcing Mechanical Properties of Organic Silica Low-k/Cu Interconnects on 300 mm Wafers,".

Kondo, S. et al., "Low-Pressure CMP for 300-mm Ultra Low-k (k=1.6-1.8)/Cu Integration,".

Kunimi, Nobutaka et al., "Effect of Bridging Groups of Precursors on Modulus Improvement in Plasma Co-Polymerized Low-k Films,".

Shimada, Miyoko et al., 3-Dimensional Structures of Pores in Low-k Films Observed by Quantitative TEM Tomograph and Their Impacts on Penetration Phenomena.

Wilson, Roy, "Session spotlights challenges of low-k materials," www.eedesign.com, Jul. 25, 2002.

Wunderlich, Jour. Polymer. Sci. Phys. Ed. vol. 11 (1973) pp. 2403-2411.

Wunderlich, Jour. Polymer. Sci. Phys. Ed. vol. 13 (1975) pp. 1925-1938.

"Technology Readiness Overview—Low-k Interlevel Dielectrics Technology—Brief description of low-k technology," http://nepp.nasa.gov/index_nasa.cfm/934/, Mar. 13, 2005.

U.S. Appl. No. 11/062,144, filed Feb. 18, 2005. Inventors are Michael A. Todd and Tominori Yoshida. See USPTO Image File Wrapper.

Char, Kockheon et al, "Material Issues for Nanoporous Ultra Low-k Dielectrics," Jun. 2004.

Dixit, Girish et al., "Film Properties and Integration Performance of a Nano-Porous Carbon Doped Oxide," 2004.

Fayolle, M. et al., "Cu/ULK integration using a post integration porogen removal approach," 2004.

Kawahara, J. et al., "A New Plasma-Enhanced Co-Polymerization (PCP) Technology for Reinforcing Mechanical Properties of Organic Silica Low-k/Cu Interconnects on 300 mm Wafers," 2003.

Kondo, S. et al., "Low-Pressure CMP for 300-mm Ultra Low-k (k=1.6-1.8)/Cu Integration," 2003.

Kunimi, Nobutaka et al., "Effect of Bridging Groups of Precursors on Modulus Improvement in Plasma Co-Polymerized Low-k Films," 2004.

Shimada, Miyoko et al., 3-Dimensional Structures of Pores in Low-k Films Observed by Quantitative TEM Tomograph and Their Impacts on Penetration Phenomena, 2004.

"Technology Readiness Overview—Low-k Interlevel Dielectrics Technology—Brief description of low-k technology," http://nepp.nasa.gov/index_nasa.cfm/934/, Mar. 13, 2005.

U.S. Appl. No. 11/062,144, filed Feb. 18, 2005. Inventors are Michael A. Todd and Tominori Yoshida. See USPTO Image File Wrapper.

Dixit et al., "Film Properties and Integration Performance of a Nano-Porous Carbon Doped Oxide," IEEE, p. 142-144 (2004).

Fayolle et al., "Cu/ULK integration using a post integration porogen removal approach," IEEE, p. 208-210 (2004).

Kawahara et al., "A New Plasma-Enhanced Co-Polymerization (PCP) Technology for Reinforcing Mechanical Properties of Organic Silica Low-k/Cu Interconnects on 300 mm Wafers," IEEE, p. 143-146 (2003).

Kondo et al., "Low-Pressure CMP for 300-mm Ultra Low-k (k=1.6-1.8)/Cu Integration," IEEE, p. 151-154 (2003).

Kunimi et al., "Effect of Bridging Groups of Precursors on Modulus Improvement in Plasma Co-Polymerized Low-$k$ Films," IEEE, p. 139-141 (2004).

Shimada et al., "3-Dimensional Structures of Pores in Low-k Films Observed by Quantative TEM Tomograph and Their Impacts on Penetration Phenomena," IEEE, p. 178-180 (2004).

\* cited by examiner

APPARATUS, PRECURSORS AND DEPOSITION METHODS FOR SILICON-CONTAINING MATERIALS

BACKGROUND OF THE INVENTION

1. Field of the Invention

This application relates generally to the deposition of silicon-containing materials in semiconductor and microelectromechanical systems (MEMS) processing. More particularly, this application relates to the production of activated Si precursors and to the polymerization of those precursors to form Si-containing films.

2. Description of the Related Art

In recent years, microelectronics manufacturers have been shrinking transistor size in integrated circuits (IC's) to improve device performance. This has resulted in increased speed and device density. The speed of an electrical signal in an IC is primarily governed by two components—the switching time of an individual transistor, known as transistor gate delay, and the signal propagation time between transistors, known as RC delay. In past years, the RC delay was negligible in comparison with the signal propagation delay. For modern sub-micron technology, however, the RC delay has become the dominant factor.

To reduce RC delay, semiconductor IC manufacturers have sought to replace the $SiO_2$ materials used in the interlevel dielectrics (ILD's) of IC's with materials having lower dielectric constants. For example, in some cases performance gains were achieved by replacing $SiO_2$ (k=3.9) with fluorinated silica glass (k~3.5). In addition, a variety of low-k porous polymeric materials have been developed for use in IC's. See, e.g., U.S. Patent Publication No. 2003/0100691 A1. However, the integration of polymeric porous materials into semiconductor device manufacturing flows has been problematic, see R. Wilson, "Session Spotlights Challenges of Low-k Materials," EE Times, July 2002. As a result, the semiconductor industry has postponed three times the transition to low-k ILD's, see "Technology Readiness Overview—Low-k Interlevel Dielectrics Technology—Brief description of low-k technology," NASA Electronic Parts and Packaging Program, August 2003. Thus, there is a long-felt need for new low-k materials and methods for making them, suitable for use in semiconductor manufacturing.

SUMMARY OF THE INVENTION

An aspect provides a method for forming a film, comprising: pyrolyzing a vaporized Si precursor in a first zone to thereby form an activated Si-containing intermediate; transporting the activated Si-containing intermediate to a second zone; and polymerizing the activated Si-containing intermediate in the second zone to thereby form a Si-containing film; the Si precursor being selected from the group consisting of

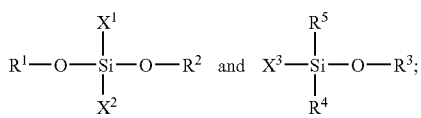

wherein: $X^1$ and $X^2$ are each individually a halogen, deuterium or H; $X^3$ is a halogen; $R^1$, $R^2$ and $R^3$ are each individually selected from the group consisting of —$C(CH_3)_3$, —$C_6H_5$, and —$NR^5R^6$; and $R^4$, $R^5$ and $R^6$ are each individually selected from the group consisting of hydrogen, deuterium, fluorine, optionally fluorinated $C_1$ to $C_6$ alkyl, optionally fluorinated $C_1$ to $C_6$ cycloalkyl, optionally fluorinated $C_1$ to $C_6$ alkoxy, and optionally fluorinated $C_6$ to $C_{10}$ aryl. Another aspect provides a Si-containing film made by such a method.

Another aspect provides a method for forming a film, comprising: transporting a pyrolyzed Si precursor to a substrate; and polymerizing the pyrolyzed Si precursor in the presence of a porogen to form a Si-containing film on the substrate, the Si-containing film comprising a least a portion of the porogen. Another aspect provides a porogen-containing Si-containing film made by such a method.

Another aspect provides a method for forming a porous film, comprising: transporting a pyrolyzed Si precursor to a substrate; polymerizing the pyrolyzed Si precursor in the presence of a porogen to form a Si-containing polymer; and forming a porous Si-containing film on the substrate, the porous Si-containing film comprising the Si-containing polymer. In an embodiment, the method comprises depositing the Si-containing polymer and the porogen on the substrate to thereby form a porogen-containing Si-containing film on the substrate; and removing at least a portion of the porogen from the porogen-containing Si-containing film to thereby form the porous Si-containing film. Another aspect provides a porous Si-containing film made by such a method.

Another aspect provides a thermal transport apparatus comprising a reaction chamber and a storage vessel operably attached to the reaction chamber, the storage vessel being configured to contain at least one reactant source selected from the group consisting of a Si precursor and a porogen;

the Si precursor being selected from the group consisting of

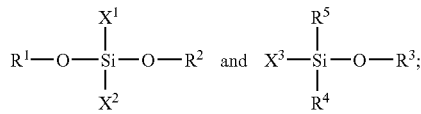

wherein:

$X^1$ and $X^2$ are each individually a halogen, deuterium or H;

$X^3$ is a halogen;

$R^1$, $R^2$ and $R^3$ are each individually selected from the group consisting of —$C(CH_3)_3$, —$C_6H_5$, and —$NR^5R^6$; and $R^4$, $R^5$ and $R^6$ are each individually selected from the group consisting of hydrogen, deuterium, fluorine, optionally fluorinated $C_1$ to $C_6$ alkyl, optionally fluorinated $C_1$ to $C_6$ cycloalkyl, optionally fluorinated $C_1$ to $C_6$ alkoxy, and optionally fluorinated $C_6$ to $C_{10}$ aryl;

the reaction chamber comprising a hot zone, a transport region downstream of the hot zone, and a polymerization zone downstream of the transport region, the hot zone being configured to accept the reactant source from the storage vessel.

These and other aspects and embodiments are described in greater detail below.

BRIEF DESCRIPTION OF THE DRAWINGS

These and other aspects of the invention will be readily apparent from the following description and from the appended drawings (not to scale), which are meant to illustrate and not to limit the invention, and in which.

DETAILED DESCRIPTION OF THE PREFERRED EMBODIMENTS

An embodiment provides a method for making a porous Si-containing film. In general terms, the preferred embodiments involve forming a pyrolyzed Si precursor, transporting the pyrolyzed Si precursor to a substrate, polymerizing the pyrolyzed Si precursor in the presence of a porogen to form a porogen-containing Si-containing film on the substrate; and removing the porogen from the Si-containing film to thereby form a porous Si-containing film. A conceptual overview is provided in FIG. 1, which schematically illustrates an embodiment.

Figure 1:
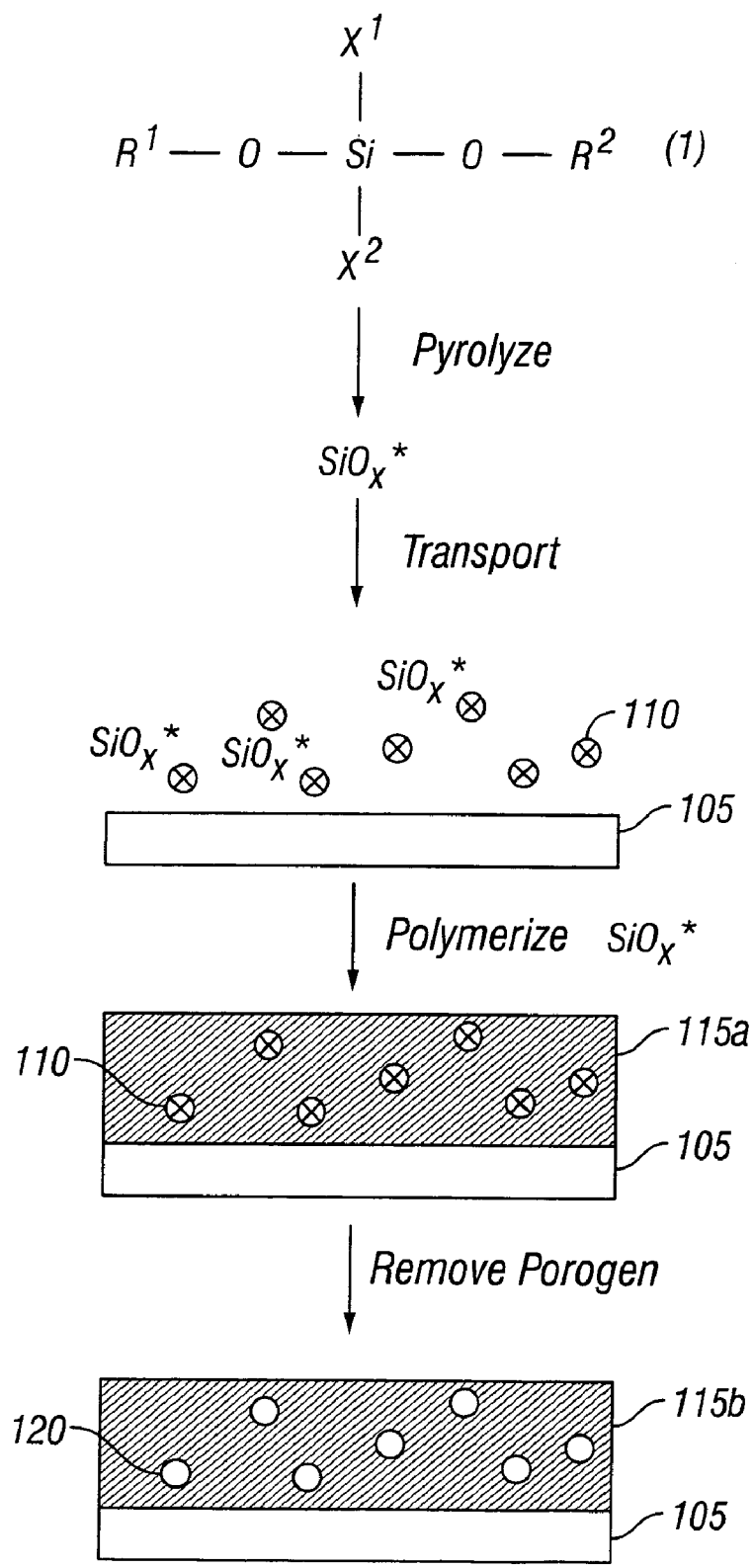
FIG. 1 illustrates aspects of an embodiment for making a porous Si-containing film.

FIG. 1 illustrates in general terms a method that begins with a Si precursor of the formula (I):

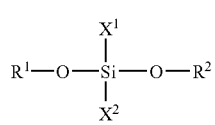
(I)

For Si precursor (I), $X^1$ and $X^2$ are preferably each individually a halogen, deuterium or H; and $R^1$ and $R^2$ are each individually selected from the group consisting of —C(CH$_3$)$_3$, —C$_6$H$_5$, and —NR$^5$R$^6$; where $R^5$ and $R^6$ are each individually selected from the group consisting of hydrogen, deuterium, fluorine, optionally fluorinated $C_1$ to $C_6$ alkyl, optionally fluorinated $C_1$ to $C_6$ cycloalkyl, optionally fluorinated $C_1$ to $C_6$ alkoxy, and optionally fluorinated $C_6$ to $C_{10}$ aryl.

FIG. 1 illustrates pyrolyzing the Si precursor (I) to form an activated Si-containing intermediate represented by "SiO$_x$*". This invention is not bound by theory, but it is believed that the activated Si-containing intermediate represented by SiO$_x$* is a Si-containing fragment of the Si precursor (I) in which x is typically in the range of about 1 to 2. The SiO$_x$* intermediate is "activated" in the sense that it is capable of polymerizing to form a largely inorganic polymer that comprises a network of silicon and oxygen atoms as discussed in greater detail below. The terms "SiO$_x$*", "SiO$_2$*", "SiO*", "SiH$_2$O*", "activated Si-containing intermediate", and "pyrolyzed Si precursor" may be used herein to refer in a general way to various activated Si-containing intermediates, and may encompass various polymerizable Si-containing species generated by pyrolyzing vaporous and/or gaseous Si precursors.

FIG. 1 further illustrates transporting the SiO$_x$* in the gas or vapor phase to the vicinity of a substrate 105. A porogen 110 is also present in the vicinity of the substrate 105. Polymerization of the SiO$_x$* in the presence of the porogen 110 results in the formation of a Si-containing film 115a on the substrate 105, the Si-containing film 115a trapping at least a portion of the porogen 110 therein. FIG. 1 further illustrates removing the porogen 110 from the film 115a to thereby form a porous Si-containing film 115b. The porous film 115b comprises pores 120 that were previously occupied by the porogen 110.

Having illustrated an embodiment in general terms in FIG. 1, a number of aspects, embodiments and variants will now be described in greater detail. It will be appreciated that the aspects, embodiments and variants described below may be practiced separately from one another or in various combinations with one another, e.g., as generally illustrated in FIG. 1.

Methods for Forming Si-containing Films

An embodiment provides a method for forming a film that includes pyrolyzing a vaporized Si precursor in a first zone to thereby form an activated Si-containing intermediate, transporting the activated Si-containing intermediate to a second zone, and polymerizing the activated Si-containing intermediate in the second zone to thereby form a Si-containing film. The pyrolyzing, transporting and polymerizing steps may be accomplished in various ways, including by thermal transport polymerization ("TP"), see, e.g., U.S. Patent Publication No. 2003/0051662 A1 and U.S. Pat. No. 6,534,616, both of which are hereby incorporated by reference and particularly for the purpose of described thermal TP. In a preferred embodiment, the Si precursor is selected from the group consisting of a Si precursor of the formula (I) and a Si precursor of the formula (II):

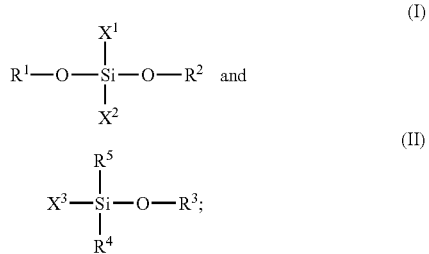

wherein $X^1$ and $X^2$ are each individually a halogen, deuterium or H; $X^3$ is a halogen; $R^1$, $R^2$ and $R^3$ are each individually selected from the group consisting of —C(CH$_3$)$_3$, —C$_6$H$_5$, and —NR$^5$R$^6$; and $R^4$, $R^5$ and $R^6$ are each individually selected from the group consisting of hydrogen, deuterium, fluorine, optionally fluorinated $C_1$ to $C_6$ alkyl, optionally fluorinated $C_1$ to $C_6$ cycloalkyl, optionally fluorinated $C_1$ to $C_6$ alkoxy, and optionally fluorinated $C_6$ to $C_{10}$ aryl.

Figure 2:
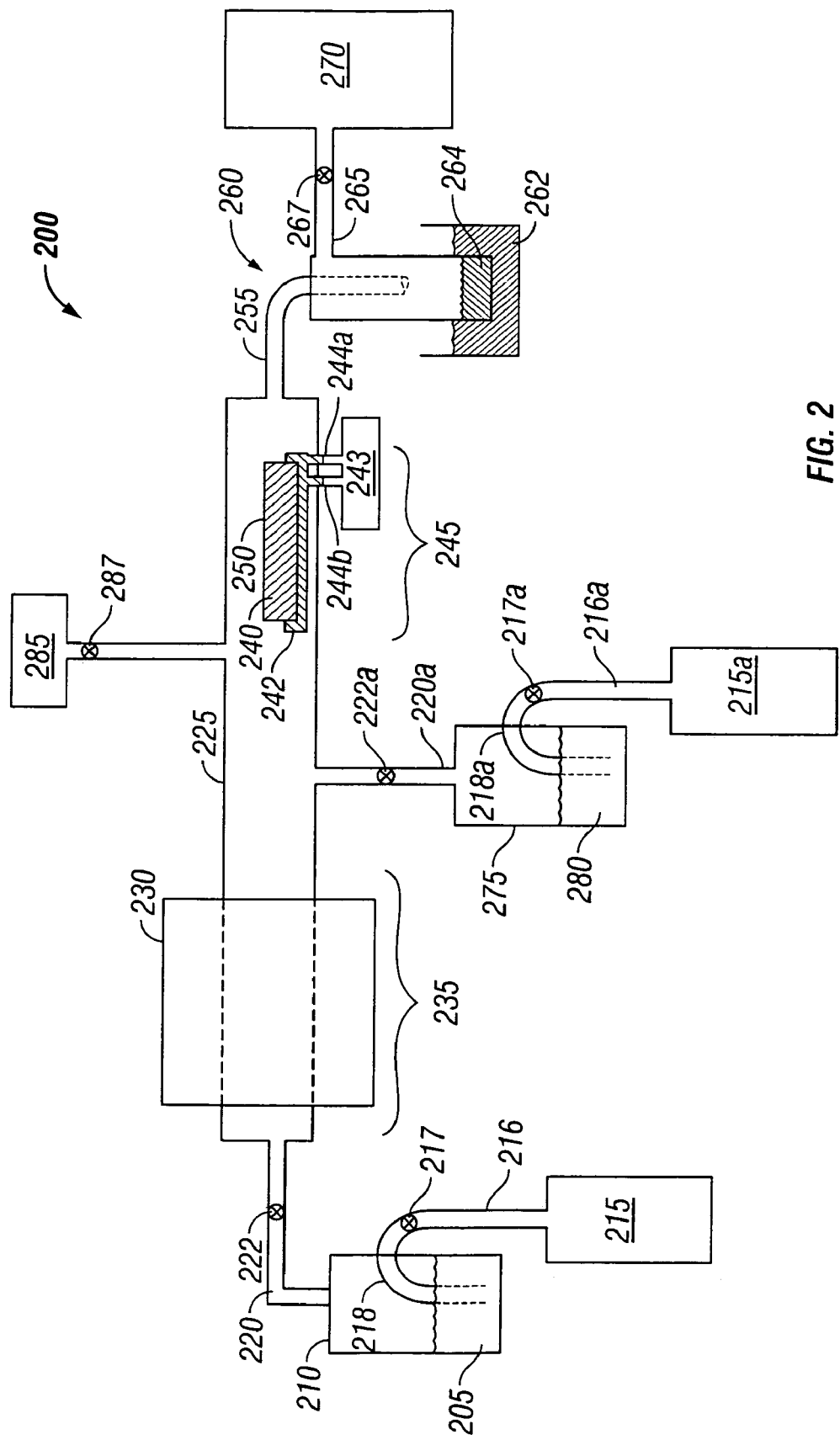
FIG. 2 illustrates an embodiment of an apparatus suitable for depositing a Si-containing film.

FIG. 2 illustrates an apparatus 200 suitable for pyrolyzing a vaporized Si precursor to form an activated Si-containing intermediate (e.g., as represented by $SiO_x{}^*$ in FIG. 1), transporting the activated Si-containing intermediate, and polymerizing the activated Si-containing intermediate to form a Si-containing film. The apparatus 200 illustrated in FIG. 2 includes a Si precursor 205 in a storage vessel 210. In the illustrated embodiment, the Si precursor 205 comprises bis-tertiarybutoxy dibromosilane. A second vessel 215 contains a nitrogen carrier gas; other carrier gases such as helium, argon, and/or neon may also be suitable. A feed line 216 equipped with a valve 217 connects the second vessel 215 to the vessel 210. In the illustrated configuration, the vessel 210 is a bubbler 218 by which, during operation, the nitrogen carrier gas supplied by the feed line 216 bubbles through the Si precursor 205 in the storage vessel 210, thereby vaporizing the Si precursor 205 to form a vaporized Si precursor. A feed line 220 equipped with a valve 222 connects the storage vessel 210 to a reaction chamber 225. It will be understood that the bubbler configuration illustrated in FIG. 2 for the supply of the Si precursor 205 is optional and may be omitted as desired, e.g., when the Si precursor 205 has a vapor pressure that is sufficiently high that suitable growth rates may be achieved by, e.g., direct draw of the Si precursor 205 into the reaction chamber 225. In an alternative embodiment (not shown in FIG. 2), the storage vessel 210 is equipped with a heater, and the vaporization of the Si precursor 205 in the storage vessel 210 is controlled by manipulating the amount of heat supplied to the storage vessel 210 by the heater. In an embodiment, the partial pressure of the Si precursor 205 in the reaction chamber 225 is controlled by manipulating the vacuum applied to the chamber 225 and the temperature of the Si precursor 205 in the storage vessel 210, without using a carrier gas.

The reaction chamber 225 is equipped with a heater 230 proximal to the feed line 220. During operation, the heater 230 heats the reaction chamber 225, thereby defining a hot zone 235 of the reaction chamber 225. The reaction chamber 225 comprises a substrate 240 and a substrate holder 242 situated within a cool zone 245 of the reaction chamber 225 distal to the feed line 220, the cool zone 245 being spaced from the hot zone 235. In the illustrated embodiment, the substrate holder 242 contains internal channels configured to circulate a cooling fluid through feed lines 244a, 244b from a temperature control unit 243, for the purpose of controlling the temperature of the substrate holder 242 and the substrate 240 during operation. While depicted as having separate hot and cool zones within the same reaction chamber, the skilled artisan will appreciate that separate pyrolyzation and deposition chambers can alternatively be provided.

During operation, the vaporized Si precursor (e.g., formed in the vessel 210 by direct draw or by bubbling nitrogen through the Si precursor 205) passes through the feed line 220 (via the valve 222) and into the hot zone 235 of the reaction chamber 225. The heater 230 heats the reaction chamber 225 to produce a temperature in the hot zone 235 that is effective to pyrolyze the vaporized Si precursor, thereby producing an activated Si-containing intermediate. In the illustrated embodiment, in which the vaporized Si precursor comprises bis-tertiarybutoxy dibromosilane, the temperature in the hot zone 235 is about 725° C. In other embodiments, the temperature in the hot zone is preferably in the range of about 500° C. to about 850° C., more preferably in the range of about 650° to about 750° C. The flow of the nitrogen carrier gas transports the activated Si-containing intermediate to the cool zone 245. The temperature of the substrate 240 in the cool zone 245 is effective to polymerize the activated Si-containing intermediate onto the substrate 240 to form a Si-containing film 250.

In the illustrated embodiment, the temperature of the substrate 240 in the cool zone 245 is maintained at about 50° C. by circulating a cooling fluid through the substrate holder 242 using the temperature control unit 243 and the cooling fluid lines 244a, 244b. In some embodiments, the temperature control unit 243 is part of an open loop system, e.g., a system in which the temperature control unit 243 comprises a source of cool water that is fed into the substrate holder 242 through the cooling fluid line 244a and drains from the substrate holder 242 through the cooling fluid line 244b. In other embodiments, the temperature control unit 243 is part of a closed loop system, e.g., a system in which the temperature control unit 243 comprises a refrigeration/pump unit that cools and circulates a cooling fluid such as ethylene glycol from the temperature control unit 243, through the cooling fluid line 244a, the substrate holder 242, and the cooling fluid line 244b back to the temperature control unit 243. Preferably, the temperature control unit 243 is equipped with a thermostatic control unit (not shown) to facilitate selection and control of the temperature of the substrate 240. Suitable open loop and closed loop cooling units are known to those skilled in the art and may be obtained from commercial sources. Preferably, the substrate 240 is cooled, rather than the walls of the reaction chamber 225, to facilitate deposition of the Si-containing film 250 on the substrate 240 and to minimize deposition on the walls of the reaction chamber 225. In an embodiment (not shown in FIG. 2), the walls of the reaction chamber 225 are heated to minimize deposition on the walls. The temperature control unit 243 may also be used to heat the substrate 240, in which case a heating fluid is circulated through the fluid line 244a, the substrate holder 242, and the fluid line 244b in the same general manner as described above. Heating of the substrate 240 may be appropriate in various circumstances, e.g., to minimize deposition of undesirable by-products, to maintain the temperature of the substrate 240 above the melting point of a porogen, and/or to remove a porogen from a porogen-containing film deposited on the substrate (discussed below). Preferably, the difference in temperature between the hot zone and the cool zone is at least about 100° C., more preferably at least about 300° C., even more preferably at least about 500° C.

FIG. 2 further illustrates that the reaction chamber 225 is equipped with an exhaust line 255 proximal to the cool zone 245. The exhaust line 255 is operably attached to a cold trap 260. In the illustrated embodiment, the cold trap 260 is cooled in liquid nitrogen 262; other coolants and cooling configurations may also be used. The cold trap 260 is equipped with an outlet 265 that leads to a vacuum pump 270. The outlet 265 is equipped with a valve 267 to control the amount of vacuum applied to the outlet 265. During operation, uncondensed by-products flow from the cool zone 245 into the exhaust line 255 and the cold trap 260. Condensable by-products 264 are collected in the trap 260 and thus are prevented from entering the vacuum pump 270. Use of the vacuum pump 270 to apply reduced pressure to the outlet 265 facilitates flow of the vaporized Si precursor, activated Si-containing intermediate, and by-products (and, optionally, carrier gas) through the apparatus 200. In the illustrated embodiment, the vacuum pump 270 is a diffusion pump capable of applying a vacuum of about $1 \times 10^{-5}$ Torr to the outlet 265.

Examples of Si precursors of the formula (I) include bis-tertiarybutoxy dibromosilane of the formula (III) and bis-tertiarybutoxy dichlorosilane of the formula (IV):

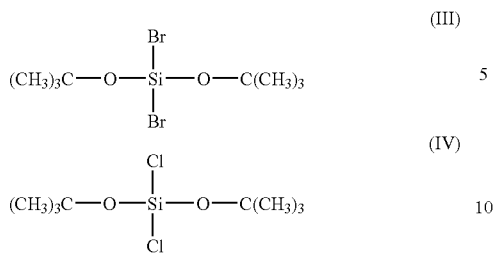

(III)

(IV)

In an embodiment, deposition using Si precursor (III) produces a Si-containing film that comprises —(SiO$_2$)— recurring units and a by-product that comprises Br—C(CH$_3$)$_3$ as illustrated in Scheme (A):

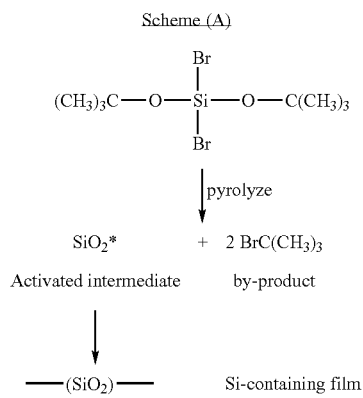

Other Si precursors of the formula (I) may be used to form Si-containing films in a manner similar to that illustrated in Scheme (A). By-products of such polymerizations preferably comprise R$^1$X$^1$, R$^1$X$^2$, R$^2$X$^1$, and R$^2$X$^2$. Mixtures comprising two or more Si precursors of the formulas (I) and/or (II) may also be used. It will be appreciated that "SiO$_2$*" in Scheme (A) represents various molecular fragments in which the ratio of silicon to oxygen may vary from fragment to fragment, and thus use of "SiO$_2$*" does not imply a particular stoichiometry for all such fragments.

Examples of Si precursors of the formula (II) include tertiarybutoxy-bromosilane of the formula (V) and tertiarybutoxy-chlorosilane of the formula (VI):

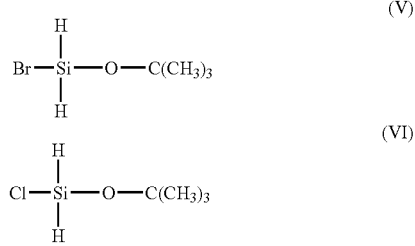

In another embodiment, deposition using Si precursor (VI) produces a Si-containing film that comprises —(SiH$_2$O)— recurring units and Cl—C(CH$_3$)$_3$ as a by-product as illustrated in Scheme (B):

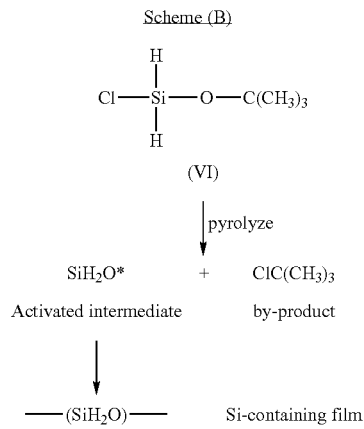

Other Si precursors of the formula (II) may be used to form Si-containing films of the general formula —(SiR$^4$R$^5$O)— in a manner similar to that illustrated in Scheme (B). By-products of such polymerizations preferably comprise R$^3$X$^3$. In an embodiment, X$^3$ is fluorine and neither R$^4$ nor R$^5$ are fluorine. Mixtures comprising two or more Si precursors of the formulas (I) and/or (II) may be used to form Si-containing films. For example, in an embodiment, Si-containing films that comprise recurring units of the general formula —[Si(R$^4$R$^5$)O]-[Si(R$^{4'}$R$^{5'}$)O]— may be formed from a mixture that comprises two different Si precursors of the formula (II), where the definitions for R$^4$, and R$^5$, are generally the same as those provided above for R$^4$ and R$^5$, respectively, but where R$^4$≠R$^{4'}$ and/or R$^5$≠R$^{5'}$ for the two different precursors. In another embodiment, Si-containing films comprising recurring units of the general formula —(SiO$_2$)—(Si(R$^4$R$^5$)O)— may be formed from a mixture that comprises a Si precursors of the formula (I) and a Si precursor of the formula (II). In an embodiment, the Si-containing film is crosslinked. For example, in a Si-containing film that comprises recurring units of the formula —(SiO$_2$)—(Si(R$^4$R$^5$)O)—, the —SiO$_2$— recurring units may form crosslinks. It will be appreciated that "SiH$_2$O*" in Scheme (B) represents various molecular fragments in which the relative ratios of silicon, oxygen and hydrogen may vary from fragment to fragment, and thus use of "SiH$_2$O*" does not imply a particular stoichiometry for all such fragments.

The temperature for pyrolyzing a Si precursor to form an activated Si-containing intermediate varies, depending on the nature of the Si precursor, and may be identified by routine experimentation in view of the guidance provided herein. Pyrolysis temperatures (e.g., temperatures in the hot zone 235) in the range of about 500° C. to about 850° C., preferably in the range of about 650° to about 750° C., are suitable for a variety of Si precursors of the formulas (I) and (II), although in particular cases higher or lower temperatures may be used. For the embodiment illustrated in FIG. 2 in which the vaporized Si precursor comprises bis-tertiarybutoxy dibromosilane, the heater 230 preferably heats the reaction chamber 225 to produce a temperature in the hot zone 235 of about 725° C. In some embodiments, e.g., as illustrated in Scheme (A), it may be desirable for the activated Si-containing intermediate to consist essentially of silicon and oxygen. In such embodiments, the pyrolysis temperature is preferably effective to result in the removal of R$^1$, R$^2$, X$^1$ and X$^2$ from Si precursor (I). In other embodiments, e.g., as illustrated in Scheme (B), it may be desirable for the activated Si-containing intermediate to consist essentially of silicon, oxygen, $R^4$ and $R^5$. In such embodiments, the pyrolysis temperature is preferably effective to result in the removal $R^3$ and $X^3$ from Si precursor (II).

Preferably, the pyrolysis temperature (e.g., the temperature in the hot zone 235) facilitates formation of a volatile by-product that does not undesirably contaminate the Si-containing film (e.g., the Si-containing film 250 that forms on the substrate 240 in the cool zone 245). For example, the temperature in the hot zone 235 is preferably lower than the temperature at which reactive by-products (e.g., by-products capable of undesirably reacting with the film 250) are formed. Instead, the pyrolysis conditions are preferably controlled so that any reactive by-products react with one another to form relatively non-reactive volatile by-products, e.g., volatile by-products that do not undergo significant or undesirable chemical reactions with the deposited Si-containing film.

In an embodiment, with reference to the Si precursors of the formulae (I) and (II), $X^1$, $X^2$, $X^3$, $R^1$, $R^2$ and $R^3$ are preferably each individually leaving groups capable of reacting with one or more of each other to form a volatile by-product. Preferably, $R^3$, $R^4$, $R^5$, and $X^3$ are each individually chemical groups selected such that the $R^4$—Si and $R^5$—Si chemical bonds are more stable during the pyrolyzing of the Si precursor than the $X^3$—Si and $R^3$—O bonds. For example, in an embodiment, $X^1$ and $X^2$ are each individually a halogen or H; $X^3$ is a halogen; $R^1$, $R^2$ and $R^3$ are each individually selected from the group consisting of —C(CH$_3$)$_3$, —C$_6$H$_5$, and —NR$^5$R$^6$; and $R^4$, $R^5$ and $R^6$ are each individually selected from the group consisting of hydrogen, deuterium, fluorine, optionally fluorinated $C_1$ to $C_6$ alkyl, optionally fluorinated $C_1$ to $C_6$ cycloalkyl, optionally fluorinated $C_1$ to $C_6$ alkoxy, and optionally fluorinated $C_6$ to $C_{10}$ aryl. In another embodiment, $R^1$ and $R^2$ are each individually selected from the group consisting of —C(CH$_3$)$_3$ and —CF$_3$, and $X^1$ and $X^2$ are each individually selected from the group consisting of hydrogen, deuterium, fluorine, methyl, and ethyl.

A Si-containing film may be formed on a substrate by transporting a pyrolyzed Si precursor to a substrate and polymerizing the pyrolyzed Si precursor. Such transport of the pyrolyzed Si precursor is typically from a hot zone (e.g., the hot zone 235) through a transport region downstream of the hot zone to a cool zone (e.g., the cool zone 245) downstream of the transport region. The conditions for transporting the pyrolyzed Si precursor are preferably selected to minimize polymerization of the pyrolyzed Si precursor at the pyrolysis temperature (e.g., in the hot zone 235) or in the gas phase (e.g., during transport through the transport region situated between the hot zone 235 and the cool zone 245). For example, the substrate 240 is preferably maintained at a temperature that is lower than in the transport region between the hot zone 235 and the substrate 240.

In an embodiment, transport of the pyrolyzed Si precursor is conducted by use of an inert carrier gas to sweep the pyrolyzed Si precursor from a first zone (e.g., the hot zone 235) to a second zone (e.g., the cool zone 245). This invention is not bound by theory, but it is believed that use of an inert carrier gas tends to dilute the pyrolyzed Si precursor, thereby reducing the rate of gas phase polymerization among activated Si-containing intermediates, and tends to separate activated Si-containing intermediates from other reactive species (such as reactive by-products), thereby reducing the rate of formation of potential Si-containing film contaminants. Use of an inert carrier gas (such as $N_2$, Ar, Xe, and He), instead of a reactive carrier gas, also tends to reduce the formation of species resulting from reaction between the activated Si-containing intermediates and the carrier gas. However, in some embodiments, it is preferable for the carrier gas to contain a minor amount of an oxygen source, e.g., to facilitate production of activated Si-containing intermediates that primarily consist of silicon and oxygen and/or to oxidize the deposited Si-containing film. Examples of suitable oxygen sources include $O_2$, $O_3$, $N_2O$ and mixtures thereof.

After transporting the activated Si-containing intermediate, polymerization to form a Si-containing film typically occurs spontaneously on a substrate that is at a temperature at which polymerization is thermodynamically favorable. The temperature of the substrate (e.g., the substrate 240) is typically selected to facilitate polymerization and is often in the range of about −50° C. to about 300° C., although higher or lower substrate temperatures may be suitable in particular cases. In some embodiments, the substrate is maintained at a relatively low temperature (e.g., in the range of about −25° C. to about 50° C.) to facilitate formation of a Si-containing film that comprises a porogen (discussed in greater detail below) and/or to achieve relatively higher deposition rates. For example, the substrate 240 may be cooled by the substrate holder 242 and the temperature control unit 243 as discussed above with respect to FIG. 2. Although cooling may result in the entrapment of by-products (such as Br—C(CH$_3$)$_3$, Scheme (A)) within the Si-containing film and such entrapped by-products may act as porogens, the temperature of the substrate is preferably selected so that the by-products are relatively volatile, so that little if any of the by-products of pyrolysis or polymerization are entrapped within the Si-containing film. Such volatile by-products may be drawn into a cold trap by the vacuum applied to the chamber or may be swept from the deposition chamber by a carrier gas, e.g., as described above with respect to FIG. 2. In an embodiment, the Si-containing film consists essentially of the polymerization product(s) of the activated Si-containing intermediate(s) formed from the Si precursor(s). In other embodiments, the substrate temperature is selected to be above the boiling temperature of the by-product(s), but below the boiling temperature of the porogen (at the deposition pressure), to facilitate removal of the by-product and incorporation of the porogen. Such embodiments are discussed in greater detail below.

Pyrolysis, transport and polymerization to form a Si-containing film as described above is preferably conducted in a chamber, e.g., the reaction chamber 225 illustrated in FIG. 2, although activated Si-containing intermediates may also be transported between separate pyrolysis and polymerization chambers. The pressure in the reaction chamber 225 may be controlled by manipulating the partial pressures of the various constituents (e.g., Si precursor, activated Si-containing intermediate, optional carrier gas, optional oxygen source, and optional porogen), the temperatures in the hot zone 235 and the cool zone 245, and the vacuum applied by the vacuum pump 270. In general, pressures at various stages of the overall process (e.g., during deposition, during subsequent heating, during subsequent porogen removal, see below) may vary over a broad range from about $1 \times 10^{-4}$ Torr to about 7,600 Torr, depending on the nature of the Si precursor and by-product(s), and the structure desired for the resulting Si-containing film (e.g., non-porous, porogen-containing, porous) as described in greater detail below. Deposition rates tend to be a function of pressure (and particularly Si precursor partial pressure), and thus relatively higher deposition rates are typically obtained at relatively higher overall pressures and/or relatively higher Si precursor partial pressures. In certain embodiments, higher Si precursor partial pressures may be achieved at lower overall pressures because such lower pressures may lead to increased volatilization of the Si precursor.

Methods for forming Si-containing films may further comprise various post-deposition film treatments such as annealing and/or oxidizing. The as-deposited Si-containing film may be annealed for various reasons, e.g., to reduce stress, to volatilize porogens and/or by-products, and/or to remove or alter undesirable chemical groups. Porogen removal is discussed in greater detail below. Annealing temperatures are typically in the range of about 50° C. to about 600° C., preferably in the range of about 150° C. to about 450° C. The chamber pressure during annealing is preferably about 600 Torr or less. Annealing times are typically in the range of 10 minutes to about 3 hours, preferably in the range of about 30 minutes to two hours. Annealing may be conducted in the deposition chamber, e.g., without exposing the as-deposited Si-containing film to ambient, and/or may be conducted by annealing an as-deposited or previously treated film after the film is removed from the deposition chamber, e.g., in a separate anneal station. In an embodiment, at least a part of the annealing is conducted under an inert gas (e.g., $N_2$, He, Ar, Ne). In another embodiment, at least a part of the annealing is conducted under a gas selected from the group consisting of nitrogen, helium, hydrogen, a nitrogen/helium mixture, and a nitrogen/hydrogen mixture.

Oxidation of the Si-containing films may be carried out with or without annealing, and may be carried out for various purposes, e.g., to alter and/or remove undesirable chemical groups from the Si-containing films. For example, in an embodiment in which it is desirable for the Si-containing film to primarily consist essentially of silicon and oxygen, elements such as carbon that may be present in the as-deposited film may be oxidized to form volatile carbon oxides (e.g., CO, $CO_2$) and thereby removed from the film. Oxidation of the Si-containing films may be conducted by exposing the Si-containing film to an oxygen-containing gas (e.g., $O_2$, $O_3$, $N_2O$ and mixtures thereof), with or without plasma activation, preferably with annealing, either within the deposition chamber after removing the as-deposited or previously treated film from the deposition chamber.

Methods for Forming Si-containing Films that Contain Porogen(s)

An embodiment provides a method for forming a film that includes transporting a pyrolyzed Si precursor to a substrate and polymerizing the pyrolyzed Si precursor in the presence of a porogen to form a Si-containing film on the substrate, the Si-containing film comprising at least a portion of the porogen. Various suitable methods for making and transporting a pyrolyzed Si precursor to a substrate are discussed above. Polymerization of a pyrolyzed Si precursor in the presence of a porogen to form a porogen-containing Si-containing film is conceptually illustrated in FIG. 1 as discussed above. Those skilled in the art will appreciate that, in the absence of a porogen or entrapped by-products, polymerization of the pyrolyzed Si precursor typically results in a relatively non-porous film that contains the chemical elements present in the pyrolyzed Si precursor from which it was made. For example, pyrolysis of the Si precursor (III) as illustrated in Scheme (A) produces a pyrolyzed Si precursor represented by $SiO_2^*$ that consists essentially of silicon and oxygen atoms. Other Si precursors of the formula (I) may be pyrolyzed similarly. Subsequent polymerization of the $SiO_2^*$ species of Scheme (A) produces a largely inorganic Si-containing film that consists essentially of —$(SiO_2)$— recurring units. In an embodiment, such a Si-containing film is an amorphous, relatively non-porous material that is chemically and structurally similar to silicon dioxide.

Similarly, polymerization of Si precursor (VI) as illustrated in Scheme (B) produces a pyrolyzed Si precursor represented by $SiH_2O^*$ that primarily consists essentially of silicon, hydrogen and oxygen atoms. Subsequent polymerization of the $SiH_2O^*$ produces a Si-containing film that primarily consists essentially of —$(SiH_2)$— recurring units. In an embodiment, such a Si-containing film is a relatively non-porous material. Other Si precursors of the formula (II) may be pyrolyzed similarly to produce pyrolyzed Si precursors that primarily consist of silicon, oxygen, $R^4$ and $R^5$, and polymerized similarly to form Si-containing films that primarily consist of the same elements as the precursors. In an embodiment, such Si-containing films are also relatively non-porous.

However, as illustrated conceptually in FIG. 1, during polymerization of a pyrolyzed Si precursor represented by $SiO_x^*$ in the presence of a porogen 110, the porogen 110 becomes entrapped within the polymerization matrix, resulting in the formation of a Si-containing film 115a that comprises at least a portion of the porogen 110 that is present during the polymerization. The porogen 110 is capable of being removed from the film to form a porous film 115b comprising pores 120 previously occupied by the porogen 110.

As used herein, the term "porogen" refers to a substance or mixture of substances that, when present during the polymerization of a pyrolyzed Si precursor to form a Si-containing film, becomes incorporated into the film in such a way as to permit it to be subsequently removed from the film to produce a porous Si-containing film that has greater porosity than an otherwise comparable Si-containing film formed by formed by an otherwise substantially identical process but in the absence of the porogen. Porogens preferably have a molecular weight of less than about 1,000 Daltons, to facilitate removal from the film. The porogen may be removed from the film during film deposition, and thus it is not necessary to detect a particular substance within a film in order to conclude that it is a porogen. Porogens or portions thereof may become chemically bonded to the film, in which case subsequent removal may involve chemical bond scission. Preferably, at least a portion of the porogen is not chemically bonded to the Si-containing film; more preferably, substantially all of the porogen is not chemically bonded to the Si-containing film.

Examples of suitable porogens include optionally halogenated $C_2$-$C_{10}$ alcohol, optionally halogenated $C_2$-$C_{10}$ diol, optionally halogenated $C_2$-$C_{10}$ ether, optionally halogenated $C_2$-$C_{10}$ ketone, optionally halogenated $C_2$-$C_{10}$ ester, optionally halogenated $C_2$-$C_{10}$ aldehyde, optionally halogenated $C_1$-$C_{10}$ hydrocarbon, optionally halogenated $C_2$-$C_{10}$ carboxylic acid, optionally halogenated $C_2$-$C_{10}$ anhydride, carbon monoxide, carbon dioxide, and mixtures thereof. Examples of preferred porogens include dimethyl oxalate, di-tertiarybutyl oxalate, carbon tetrabromide, benzene, methanol, t-butanol and mixtures thereof.

FIG. 2 illustrates an apparatus 200 suitable for transporting a pyrolyzed Si precursor to a substrate and polymerizing the pyrolyzed Si precursor in the presence of a porogen to form a porogen-containing Si-containing film on the substrate. The apparatus 200 includes a vessel 275 and a feed line 276 running from the vessel 275 to a transport region of the reaction chamber 225 between the hot zone 235 and the cool zone 245. The vessel 275 contains a porogen 280, which in the illustrated embodiment comprises di-tertiarybutyl oxalate. A bubbler configuration similar to that used to supply the Si precursor 205 to the reaction chamber 225 is used to supply the porogen 280 to the reaction chamber 225. In this configuration, another vessel 215a contains a nitrogen carrier gas;

other carrier gases such as helium, argon, and/or neon may also be suitable. A feed line 216a equipped with a valve 217a connects the vessel 215a to the vessel 210. In the illustrated configuration, the vessel 275 is a bubbler 218a by which, during operation, the nitrogen carrier gas supplied by the feed line 216a bubbles through the porogen 280 in the storage vessel 275, thereby vaporizing the porogen 280 to form a vaporized porogen. A feed line 220a equipped with a valve 222a connects the storage vessel 275 to the reaction chamber 225. It will be understood that the bubbler configuration illustrated in FIG. 2 for the supply of the porogen 280 is optional and may be omitted as desired, e.g., when the porogen 280 has a vapor pressure that is sufficiently high that suitable levels of porogen incorporation into the film 250 may be achieved by, e.g., direct draw of the porogen 280 into the reaction chamber 225. In an alternative embodiment (not shown in FIG. 2), the storage vessel 275 is equipped with a heater, and the vaporization of the porogen 280 in the storage vessel 275 is controlled by manipulating the amount of heat supplied to the storage vessel 275 by the heater. In an embodiment, the partial pressure of the porogen 280 in the reaction chamber 225 is controlled by manipulating the vacuum applied to the chamber 225 and the temperature of the porogen 280 in the storage vessel 275, without using a carrier gas.

During operation, the porogen 280 enters the reaction chamber 225 via the feed line 220a and the valve 222a. The porogen 280 flows into the cool zone 245 and into the presence of the pyrolyzed Si precursor at the substrate 240. Polymerization of the pyrolyzed Si precursor to form the Si-containing film 250 on the substrate 240 takes place in the general manner described above, except that at least a portion of the porogen 280 is entrapped within the Si-containing film 250 during the polymerization, thereby forming a Si-containing film that comprises a least a portion of the porogen 280.

Methods for forming porogen-containing Si-containing films may further comprise various post-deposition film treatments such as annealing and/or oxidizing. The as-deposited porogen-containing Si-containing film may be annealed for various reasons, e.g., to reduce stress, to remove trapped porogens and/or by-products, and/or to remove or alter undesirable chemical groups. Annealing temperatures are typically in the range of about 50° C. to about 600° C., preferably in the range of about 150° C. to about 450° C. Annealing times are typically in the range of 10 minutes to about 3 hours, preferably in the range of about 30 minutes to two hours. Annealing may be conducted in the deposition chamber, e.g., without exposing the as-deposited porogen-containing Si-containing film to ambient, and/or may be conducted by annealing an as-deposited or previously treated film after the film is removed from the deposition chamber in a separate anneal station, with or without exposure to ambient. For example, annealing may be accomplished by heating the substrate 240 and the Si-containing film 250 using the temperature control unit 243. The pressure during annealing may be controlled by manipulating the vacuum applied by the vacuum pump 270 via valve 267. The chamber may also be pressurized by filling the reaction chamber 225 with a gas e.g., by attaching a third gas source 285 to the reaction chamber 225 via a valve 287, using appropriate precautions for dealing with pressurized systems. In an embodiment, at least a part of the annealing is conducted under an inert annealing gas (e.g., $N_2$, He, Ar, Ne). In another embodiment, at least a part of the annealing is conducted under an annealing gas selected from the group consisting of nitrogen, helium, hydrogen, a nitrogen/helium mixture, and a nitrogen/hydrogen mixture. Thus, the third gas source 285 may comprise such an annealing gas or gases.

Oxidation of the porogen-containing Si-containing films may be carried out with or without annealing, and may be carried out for various purposes, e.g., to alter and/or remove undesirable chemical groups from the Si-containing films and/or to remove the porogen by oxidation. For example, oxidation may be preferred in an embodiment in which removal of the porogen by volatilization is difficult or inconvenient and in which the oxidation of the porogen produces oxides having greater volatility. Oxidation of the Si-containing films and/or porogens contained therein may be conducted by exposing the porogen-containing Si-containing film to an oxygen-containing gas (e.g., $O_2$, $O_3$, $N_2O$ and mixtures thereof), with or without plasma activation, preferably with annealing, either within the deposition chamber after removing the as-deposited or previously treated film from the deposition chamber. Such oxygen-containing gases may comprise the third gas source 285 and thus may be introduced into the reaction chamber 225 via the valve 287.

As noted above, the chamber pressure may be varied over a broad range, e.g., from about 7,600 Torr to about $1\times10^{-4}$ Torr, depending on the stage of the overall process. In one embodiment, the pressure during annealing is relatively low to facilitate removal of the porogen, as discussed in greater detail below. In another embodiment, the pressure during annealing or during an annealing stage is relatively high, e.g. in the range of about 760 Torr to about 7,600 Torr. Such pressures may be applied during annealing to minimize or prevent volatilization of an entrapped porogen from a Si-containing film during annealing. For example, prior to removing the porogen, it may be desirable to anneal a porogen-containing Si-containing film to stabilize the structure of the Si-containing film surrounding the porogen.

Porogen-containing Si-containing films (e.g., the film 115a in FIG. 1) preferably contain an amount of porogen that is effective to produce a porous film (e.g., the film 115b in FIG. 1) having the desired degree of porosity upon removal of the porogen. Amounts of porogen in the porogen-containing Si-containing film may vary over a broad range, e.g., form about 0.001% to about 70% by weight, based on total film weight, depending on the application. The dielectric constants of porous films generally decrease as the degree of porosity increases, but in many cases the mechanical properties of porous films also tend to decrease as the degree of porosity increases. Thus, preferred levels of porogen in a particular porogen-containing Si-containing film typically represent a balance between dielectric and mechanical properties, and may be in the range of about 0.01% to about 40%, more preferably about 1% to about 30%, by weight based on total film weight. The porogen may be distributed relatively uniformly throughout the film or varied as a function of position within the film.

In an embodiment, the amount of porogen in the porogen-containing Si-containing film is varied as a function of depth in the film. For example, in certain embodiments it may be desirable to form a graded porous Si-containing film having a degree of porosity that changes as a function of depth in the film. One way of making such a graded film is from a similarly graded porogen-containing Si-containing film. The amount of porogen incorporated into the porogen-containing Si-containing at any particular film depth is a function of the relative amount of porogen present during the polymerization of the pyrolyzed Si precursor. The relative amount of porogen may be controlled in various ways. For example, in the illustrated embodiment, the valve 222a and/or the flow of the nitrogen carrier gas 215a (via the valve 217a) may be manipulated during deposition to control the flow of the porogen 280 into the reaction chamber 225. The relative amount of porogen present during polymerization may also be controlled by varying the amount of Si precursor, e.g., by reducing the flow of the Si precursor 215 (e.g., by manipulation of the valve 217 and/or the valve 222), thereby increasing the relative amount of the porogen 280 at the substrate 240, or vice-versa. Mass flow controllers (MFC's) may be provided in addition to or in place of each of the indicated valves in FIG. 2. In an embodiment, the concentration of porogen in the film is graded, e.g., the concentration of porogen is lower near a surface of a porogen-containing Si-containing film as compared to the concentration of porogen near the center of the porogen-containing Si-containing film. Such a graded concentration porogen-containing Si-containing film is useful for making correspondingly graded porous films by removal of the porogen as discussed below.

Methods for Forming Porous Films

An embodiment provides a method for forming a porous film, comprising: transporting a pyrolyzed Si precursor to a substrate; polymerizing the pyrolyzed Si precursor in the presence of a porogen to form a Si-containing polymer; and forming a porous Si-containing film on the substrate, the porous Si-containing film comprising the Si-containing polymer. Various suitable methods for making a pyrolyzed Si precursor, transporting it to a substrate, and polymerizing it in the presence of a porogen are discussed above. In some embodiments, such polymerization results in the formation of a porous Si-containing film, without the formation of a discrete intermediate porogen-containing Si-containing film. In other embodiments, e.g., as illustrated conceptually in FIG. 1, the method involves forming a porogen-containing intermediate film 115a and then removing the porogen 110 to create the porous Si-containing film 115b. Preferably, in such embodiments, the method further comprises depositing the Si-containing polymer and the porogen on the substrate to thereby form the porogen-containing Si-containing film 115a on the substrate 105; and removing at least a portion of the porogen 110 from the porogen-containing Si-containing film 115a to thereby form the porous Si-containing film 115b.

Porogens may be removed in various ways from porogen-containing Si-containing films to form porous Si-containing films. It has been found that a number of factors may affect porogen removal including porogen volatility, time, temperature, pressure, and/or environmental conditions (e.g., presence or absence of water, oxygen, hydrogen, inert gas, etc., during porogen removal). In most cases, removal of the porogen may be accomplished by establishing suitable volatilization conditions, e.g., by manipulating the temperature and pressure applied to the porogen-containing Si-containing film so that the film is at a temperature that is near or above the boiling point or sublimation temperature of the porogen at the applied pressure. The volatilization conditions (e.g., temperature and pressure) for a particular porogen may be readily determined by consulting the appropriate literature references known to those skilled in the art or by routine experimentation. Temperatures lower than the boiling or sublimation point of the particular porogen at the applied pressure may be suitable, but result in slower volatilization. Those skilled in the art will appreciate that relatively faster and more complete volatilization is typically achieved by applying relatively higher temperatures and/or lower pressures.

The porous Si-containing film may be formed in the same chamber as the porogen-containing Si-containing film. For example, as discussed above with reference to FIG. 2, the as-deposited Si-containing film 250 may be heated for various reasons, e.g., to reduce stress, to volatilize porogens and/or by-products, and/or to remove or alter undesirable chemical groups. In an embodiment in which the Si-containing film 250 comprises a porogen 280, the porogen 280 may be removed while the Si-containing film 250 remains in the reaction chamber 225. For example, porogen removal may be accomplished by heating the substrate 240 and the Si-containing film 250 using the temperature control unit 243. Manipulating the vacuum applied by the vacuum pump 270 via valve 267 may control the pressure during removal. The chamber may also be pressurized by filling the reaction chamber 225 with a gas (e.g., the nitrogen gas 215, 215a, and/or the third gas 285), optionally with heating, using appropriate precautions for dealing with pressurized systems. The third gas 285 may be selected from the group consisting of $N_2$, He, Ar, Ne, hydrogen, and mixtures thereof such as nitrogen/helium and nitrogen/hydrogen. In addition to or instead of conducting porogen removal in the reaction chamber 225, porogen removal may be accomplished after removing the Si-containing film 250 from the reaction chamber 225, e.g., by allowing porogen volatilization under ambient conditions and/or by placing the Si-containing film 250 into a second chamber (not shown), with or without exposure to ambient, and applying the appropriate temperature/pressure/time conditions. Temperatures during porogen removal are typically in the range of about 50° C. to about 600° C., preferably in the range of about 150° C. to about 450° C. Porogen removal times are typically in the range of 10 minutes to about 3 hours, preferably in the range of about 30 minutes to two hours. Pressure during porogen removal may be in the range of about 7,600 Torr to about $1 \times 10^{-4}$ Torr, preferably about 600 Torr or less, more preferably about 50 Torr or less, even more preferably about 1 Torr or less.

Removal of the porogen from the porogen-containing Si-containing film may also be accomplished by chemically reacting the porogen (e.g., by exposing the porogen-containing Si-containing film to a reactive gas), thereby forming porogen by-products that may then be removed from the film. For example, the third gas 285 may comprise an oxygen-containing gas (e.g., $O_2$, $O_3$, $N_2O$ and mixtures thereof) or a gas that comprises hydrogen such as hydrogen itself or a nitrogen/hydrogen mixture. The third gas 285 may be introduced to the reaction chamber 225 during all or a portion of the time that the porogen is being removed from the porogen-containing film, thereby reacting with the porogen to form volatile by-products. Temperatures during such reactive removal of the porogen are typically in the range of about 50° C. to about 600° C., preferably in the range of about 150° C. to about 450° C. The porogen-containing Si-containing film may be exposed to the reactive gas for periods of time in the range of 10 minutes to about 3 hours, preferably in the range of about 30 minutes to two hours. Pressure during reactive removal may be in the range of about 7,600 Torr to about $1 \times 10^{-4}$ Torr, preferably about 600 Torr or less, more preferably about 50 Torr or less, even more preferably about 1 Torr or less. Reactive removal is preferred when the porogen is chemically bonded to the porogen-containing Si-containing film.

The porosity of the porous Si-containing film (e.g., the film 115b) may be varied over a broad range by controlling the amount of the porogen 110 incorporated into the porogen-containing film 115a and by controlling the amount of porogen 110 removed from the porogen-containing film 115a during porogen removal. As discussed above, the porogen-containing Si-containing films 115a preferably contain an amount of porogen that is effective to produce a porous film 115b having the desired degree of porosity upon removal of the porogen. In an embodiment, porous Si-containing films are suitable for use as low-k films in semiconductor and MEMS applications. The dielectric constants of porous films generally decrease as the degree of porosity increases, but in many cases the mechanical properties of porous films also tend to decrease as the degree of porosity increases. Thus, depending on the balance of mechanical and dielectric properties desired for a particular application, the dielectric constant of the porous Si-containing film may vary over a broad range from about 1.8 to about 4.0, preferably from about 2.0 to about 3.8.

It will be appreciated that the methods described herein may be used to incorporate the porogen into the porogen-containing film in highly uniform manner that minimizes undesirable levels of clustering or agglomeration of the porogen within film. For example, the porogen may be finely dispersed within the porogen containing film at the molecular level. Such uniformity may be maintained upon removal, such that a substantial fraction of the pores in the resulting porous Si-containing film have a size that corresponds to size of the porogen molecule that previously occupied the pore. Thus, in an embodiment, the porous Si-containing film comprises nanopores. Preferred porous Si-containing films comprise nanopores having a size that corresponds to about 10 porogen molecules or less, more preferably about 5 porogen molecules or less, even more preferably about 2 porogen molecules or less. Depending on the size of the porogen molecule(s) used to form the porous film, the number average volume of the pores in the Si-containing film may be about 10 $nm^3$ or less, preferably about 5 $nm^3$ or less, even more preferably about one $nm^3$ or less. Porosity may be characterized by atomic force microscopy of cross-sectioned samples. The density of the porous Si-containing films may also vary over a broad range, depending on the degree of porosity. In an embodiment, porous Si-containing films have a density of about 2.34 $g/cm^{-3}$ or less, preferably about 2.08 $g/cm^{-3}$ or less, more preferably about 1.82 $g/cm^{-3}$ or less, even more preferably about 1.56 $g/cm^{-3}$ or less.

In an embodiment, the porous Si-containing film has a degree of porosity that changes as a function of depth in the film. Such a film may be prepared by volatilizing the porogen from a porogen-containing Si-containing film in which the amount of porogen is varied as a function of depth in the film. Methods for making such graded porogen-containing films are described above. The general methods described above for volatilizing the porogen from porogen-containing films also apply to graded porogen-containing films. In an embodiment, the degree of porosity is lower near a surface of a porous Si-containing film as compared to the degree of porosity near the center of the porous Si-containing film. Such porous Si-containing films may have a graded mechanical property profile in which the mechanical properties are higher near the surface (where porosity is lower). In some cases, uniform porous materials may have correspondingly weaker mechanical properties, and thus may have undesirably weaker surface interactions (such as bond strengths) with other materials. In an embodiment, graded porous Si-containing films (having a degree of porosity that is lower near a surface than near the center) have relatively low dielectric constants (e.g., in the range of about 3.3 to about 3.8) and acceptable surface interactions (such as bond strength) with other materials, comparable to or only slightly less (e.g., less than 10% reduction) than bulk $SiO_2$.

As discussed above, FIG. 1 conceptually illustrates forming the porous film 115b that contains pores 120 previously occupied by the porogen 110. The illustrated embodiment involves the formation of an intermediate porogen-containing Si-containing film 115a that comprises at least a portion of the porogen 110 that is present during the polymerization of $SiO_x^*$. However, it will be appreciated that the porogen 110 may be trapped within the film 115a for relatively short periods of time, e.g., for a time that is less than the formation time for the porous film 115b, and/or the presence of the porogen may initiate the formation of pores in the resulting film 115b without the porogen becoming trapped in the film 115a, and/or the structure and porogen content of the film 115a may change during deposition. Thus, in some embodiments the intermediate porogen-containing film 115a is difficult to characterize, short-lived, transient or variable in nature. In other embodiments, the porous film 115b is formed directly from the polymerization of $SiO_x^*$ in the presence of the porogen 110, without the formation of the discrete intermediate porogen-containing Si-containing film 115a per se. Thus, methods described herein for making porous films from intermediate porogen-containing film also apply to porous films formed directly from the polymerization of $SiO_x^*$ in the presence of the porogen.

EXAMPLES

Depositions described in the Examples below were carried out using a deposition system of the general design illustrated in FIG. 2. The system was cleaned and thoroughly dried using heating and pumping overnight under vacuum (diffusion pump, nominal vacuum $10^{-5}$ Torr) using a cold trap (liquid nitrogen, about −196° C.) prior to deposition. During deposition, the precursor was fed by unimpeded direct vapor draw at the nominal pressure applied by the diffusion pump, the temperature in the hot zone was about 725° C., and the cold trap was maintained at about −196° C., unless otherwise stated. Si-precursor, porogen, substrate temperature, and annealing conditions were varied as described below.

Examples 1-2

Figure 3:
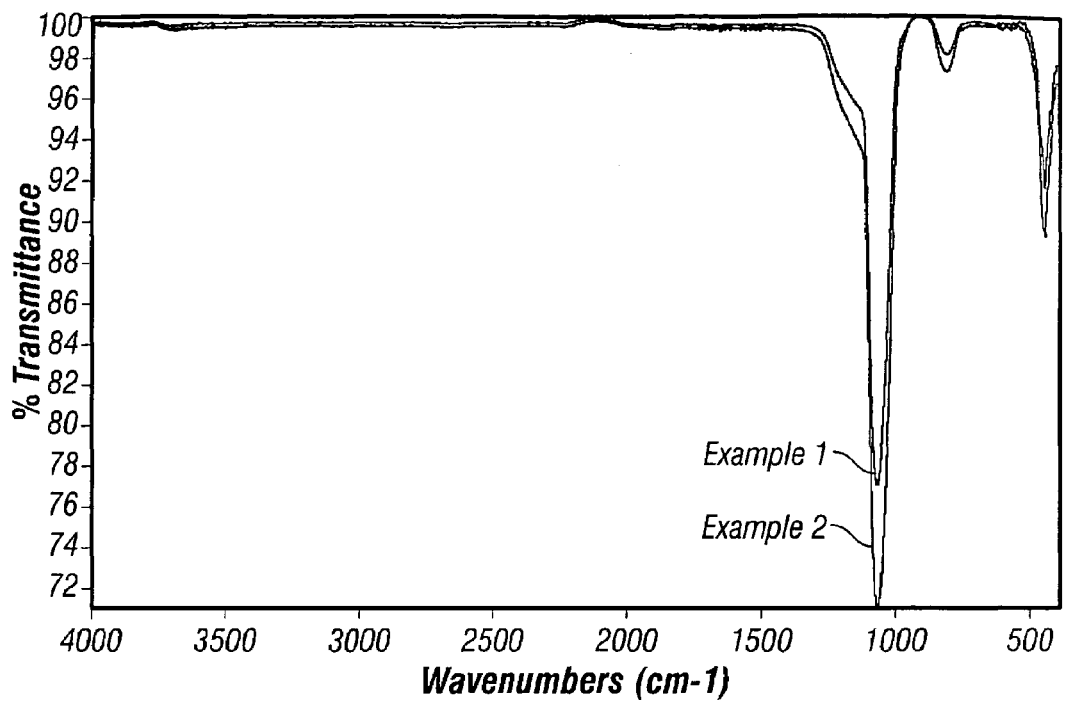
FIG. 3 shows FTIR spectra of embodiments of Si-containing films.

Two Si-containing films were deposited using bis-tertiarybutoxy dichlorosilane of the formula (IV). No porogen was used. The substrate temperature was about 0° C. By-product Cl—$C(CH_3)_3$ was isolated from the cold trap, indicating that $SiO_x^*$ was formed and subsequently polymerized to form the Si-containing film (comprising —($SiO_2$)— recurring units) in a manner similar to that illustrated in Scheme (A) for bis-tertiarybutoxy dibromosilane. After deposition, both films were exposed to air for several days. The films were then thermally annealed at 420° C. for one hour under either air (Example 1) or nitrogen (Example 2). The resulting Si-containing films were characterized by infrared spectroscopy (FTIR) as shown in FIG. 3. The FTIR spectra shown in FIG. 3 confirm that the deposited film was a three-dimensional network of silicon and oxygen atoms comprising —($SiO_2$)— recurring units.

Examples 3-4

Figure 4:
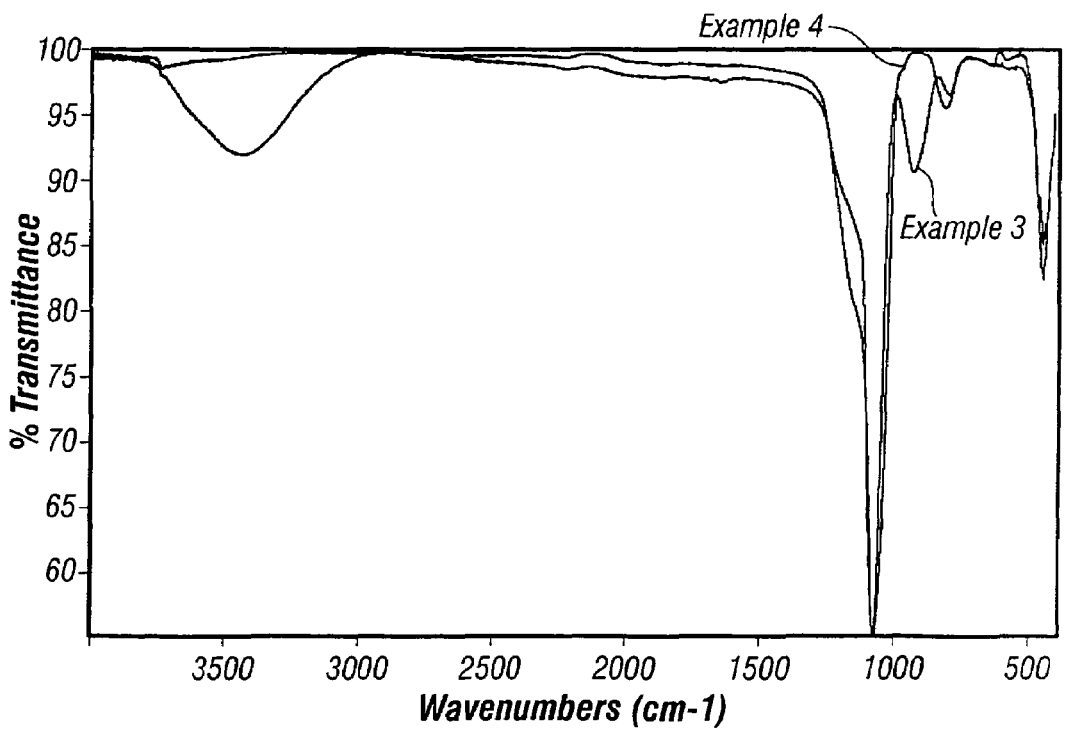
FIG. 4 shows FTIR spectra of embodiments of Si-containing films.

A Si-containing film was deposited using bis-tertiarybutoxy dibromosilane of the formula (III). No porogen was used. The substrate temperature was about 0° C. By-product Br—$C(CH_3)_3$ was isolated from the cold trap, indicating that $SiO_x^*$ was formed and subsequently polymerized to form the Si-containing film (comprising —($SiO_2$)— recurring units as illustrated in Scheme (A)). The resulting Si-containing film was characterized by FTIR before annealing (Example 3) and after annealing at 400° C. for one hour under vacuum (Example 4) as shown in FIG. 4. The FTIR spectra shown in FIG. 4 confirm that both of the films were three-dimensional networks of silicon and oxygen atoms comprising —($SiO_2$)— recurring units. The spectra also show that the as-deposited film (Example 3) contained Si—OH bonds after exposure to air as indicated by the Si—OH stretching-bending mode observed near 925 cm$^{-1}$, and that annealing under vacuum (Example 4) changed the structure of the film by reducing the amount of hydroxyl groups in the network.

Examples 5-6

Figure 5:
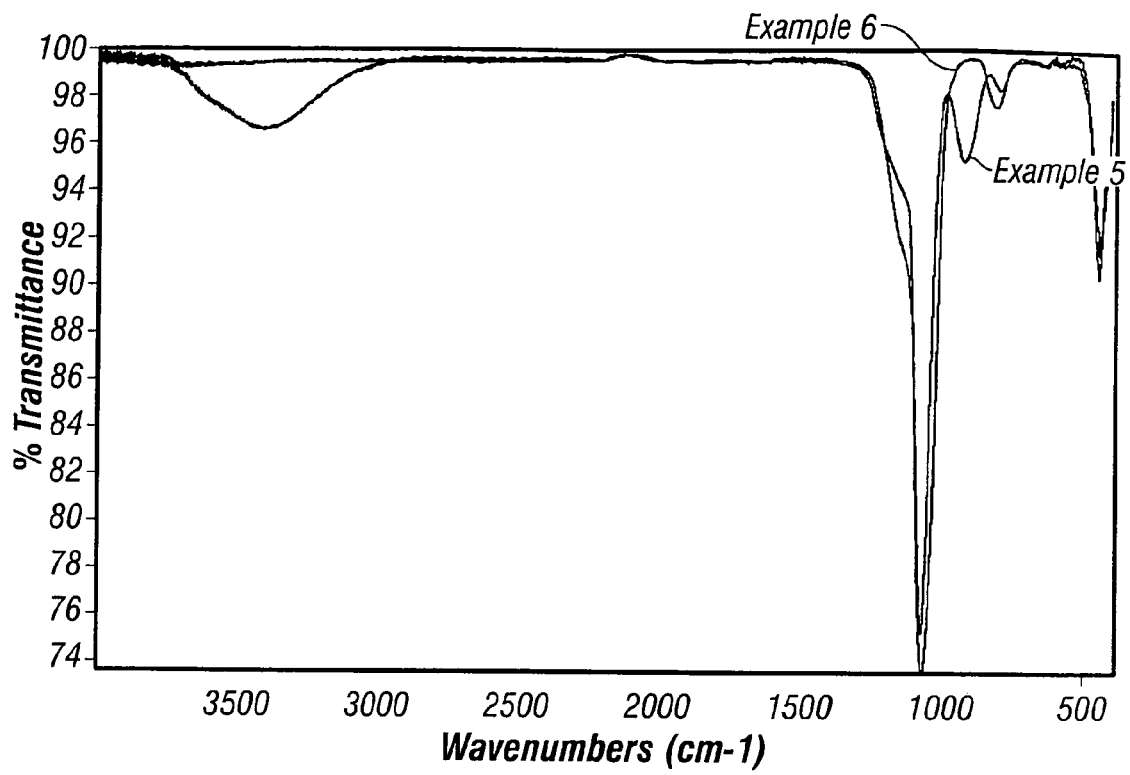
FIG. 5 shows FTIR spectra of embodiments of Si-containing films.

A Si-containing film was deposited in the same manner described for Examples 3-4 and characterized by FTIR before annealing (Example 5) and after annealing at 400° C. for one hour under a gas mixture containing 5% $H_2$ and 95% $N_2$ (Example 6) as shown in FIG. 5. The FTIR spectra shown in FIG. 5 confirm that both of the films were three-dimensional networks of silicon and oxygen atoms comprising —(SiO$_2$)— recurring units. The spectra also show that the as-deposited film (Example 5) contained Si—OH bonds after exposure to air as indicated by the Si—OH stretching-bending mode observed near 925 cm–1, and that annealing under $H_2/N_2$ (Example 6) changed the structure of the film by reducing the amount of hydroxyl groups in the network.

Example 7

Figure 6:
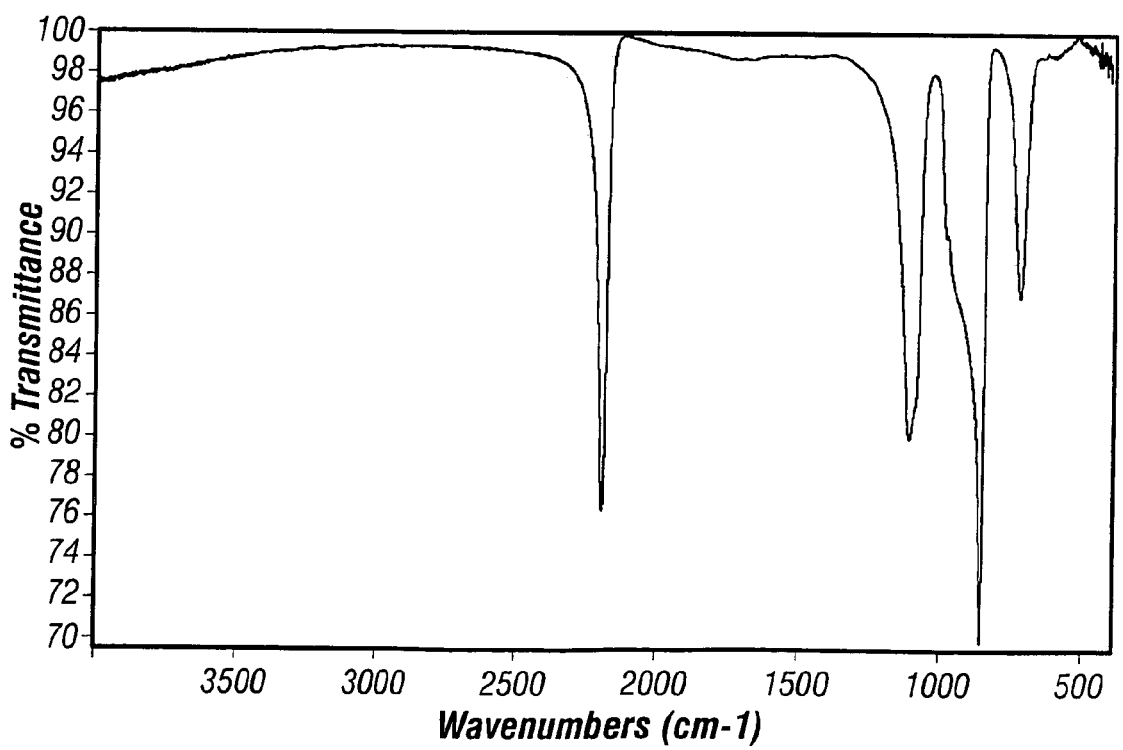
FIG. 6 shows an FTIR spectrum of an embodiment of a Si-containing film.

A Si-containing film was deposited using tertiarybutoxy chlorosilane of the formula (VI). No porogen was used. The substrate temperature was about 20° C. By-product Cl—C(CH$_3$)$_3$ was isolated from the cold trap, indicating that SiH$_2$O* was formed and subsequently polymerized to form the Si-containing film (comprising —(SiH$_2$O)— recurring units) in the manner illustrated in Scheme (B). The Si-containing film was characterized by FTIR as shown in FIG. 6. The FTIR spectrum shown in FIG. 6 exhibits strong Si—H stretching at ~2189 cm$^{-1}$, strong Si—O stretching at ~1106 cm$^{-1}$, strong Si—H bending at 850 cm$^{-1}$, and strong Si—O bending at ~716 cm$^{-1}$. The FTIR spectrum confirms that the deposited film comprised —(SiH$_2$O)— recurring units. The lack of Si—O rocking peaks in the spectrum indicates that the film did not have a three-dimensional SiO$_2$ structure.

Example 8

Figure 7:
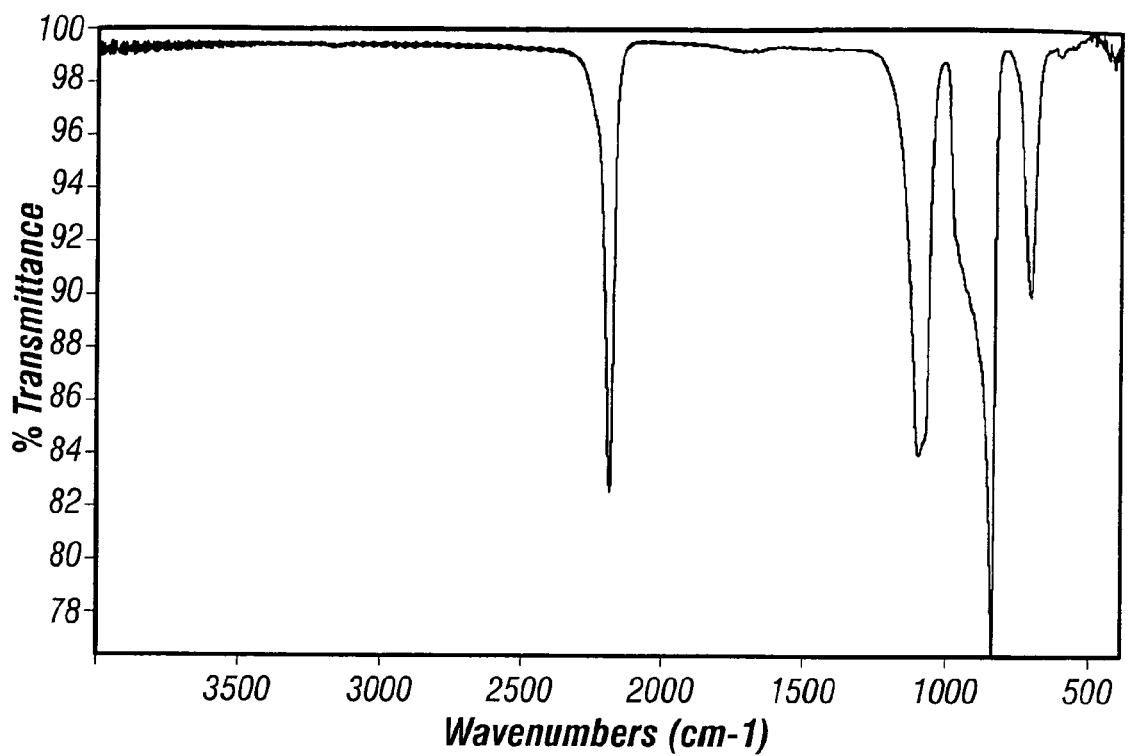
FIG. 7 shows an FTIR spectrum of an embodiment of a Si-containing film.

A Si-containing film was deposited using bis-tertiarybutoxy silane of the formula $H_2Si(OC(CH_3)_3)_2$ at a hot zone temperature of about 650° C. No porogen was used. The substrate temperature was about 20° C. The Si-containing film was characterized by FTIR as shown in FIG. 7. The FTIR spectrum shown in FIG. 7 is very similar to that of FIG. 6, indicating that the deposited film comprised —(SiH$_2$O)— recurring units and lacked a three-dimensional SiO$_2$ structure.

Example 9

Figure 8:
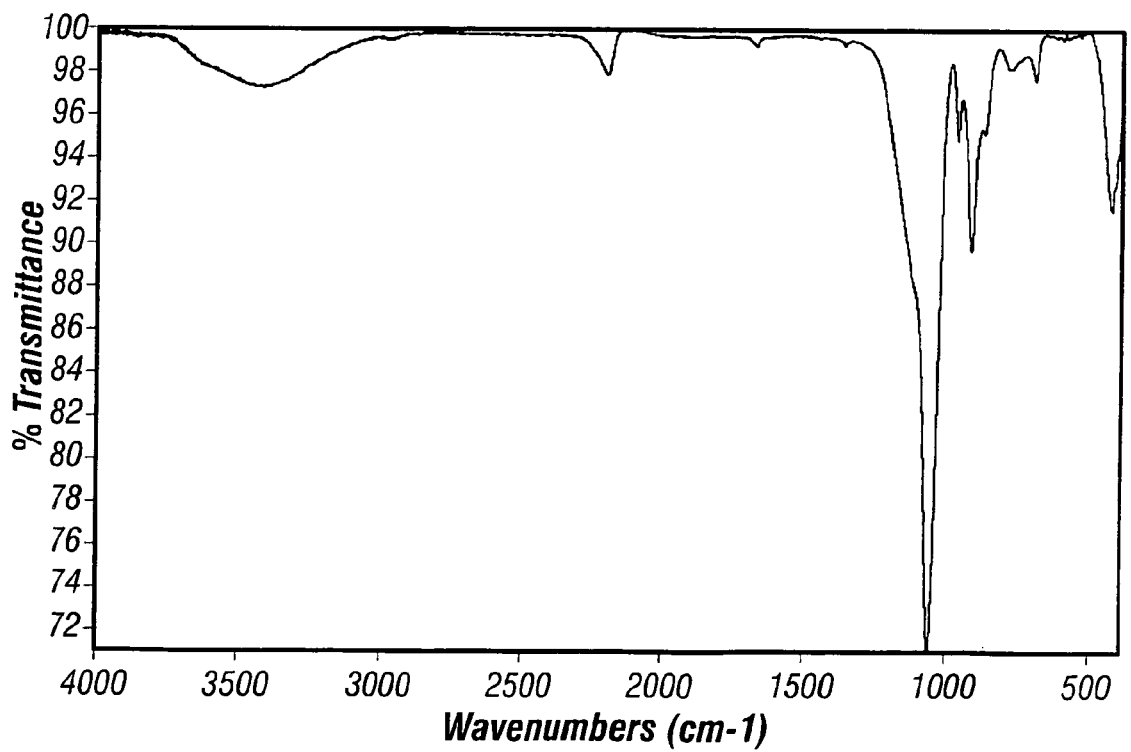
FIG. 8 shows an FTIR spectrum of an embodiment of a Si-containing film.

A Si-containing film was deposited using a mixture of bis-tertiarybutoxy dibromosilane of the formula (III) and bis-tertiarybutoxy silane of the formula $H_2Si(OC(CH_3)_3)_2$ at a hot zone temperature of about 700° C. No porogen was used. The substrate temperature was about 0° C. The Si-containing film was characterized by FTIR as shown in FIG. 8. The FTIR spectrum shown in FIG. 8 confirms that the film comprises both —(SiO$_2$)— and —(SiH$_2$O)— recurring units (compare to FIG. 4 and FIG. 7).

Examples 10-14

Figure 9:
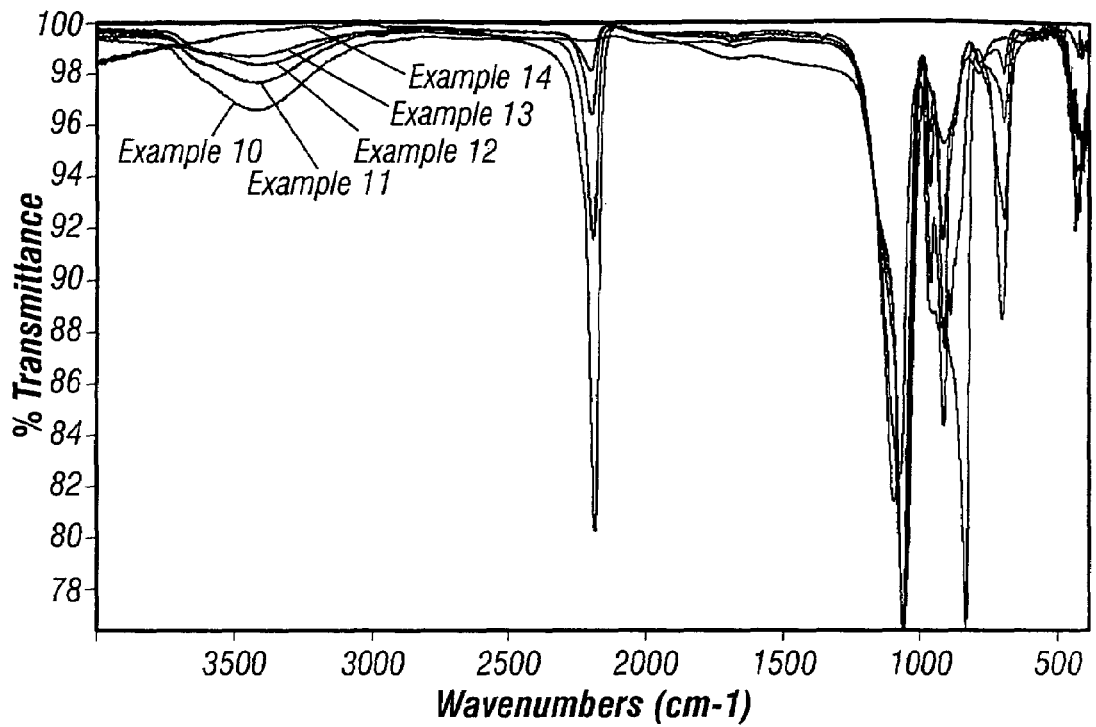
FIG. 9 shows FTIR spectra of embodiments of Si-containing films.

A series of Si-containing films were deposited in the manner described in Example 9, except that each of the films was deposited using a different ratio for the partial pressure of bis-tertiarybutoxy dibromosilane to bis-tertiarybutoxy silane to thereby control the ratio of —(SiO$_2$)— to —(SiH$_2$O)— recurring units, respectively, incorporated into the film. The Si-containing film of Example 10 was deposited using bis-tertiarybutoxy dibromosilane (without bis-tertiarybutoxy silane); the Si-containing film of Example 14 was deposited using bis-tertiarybutoxy silane (without bis-tertiarybutoxy dibromosilane); and the Si-containing films of Examples 11-13 were deposited using both Si-precursors, at various intermediate ratios. The resulting Si-containing films were characterized by FTIR as shown in FIG. 9. The FTIR spectra shown in FIG. 9 demonstrate that the compositions of the films varied in accordance with the partial pressures of the Si precursors.

Examples 15-16

Figure 10:
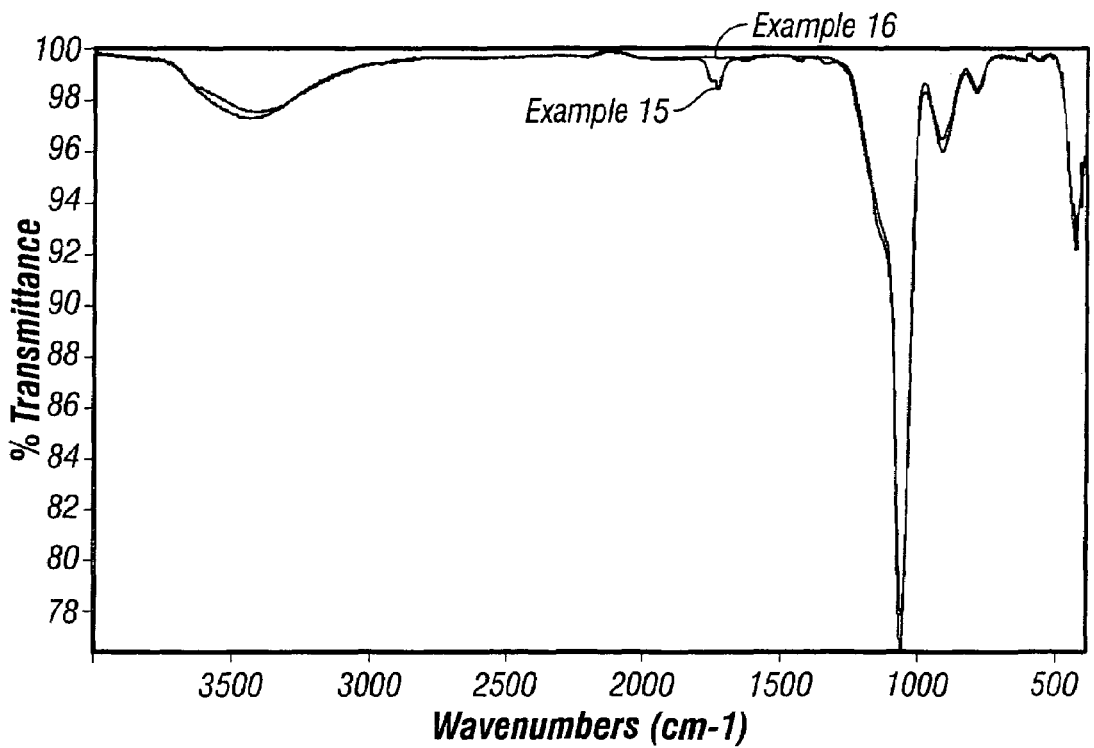
FIG. 10 shows FTIR spectra of embodiments of Si-containing films.
Figure 11:
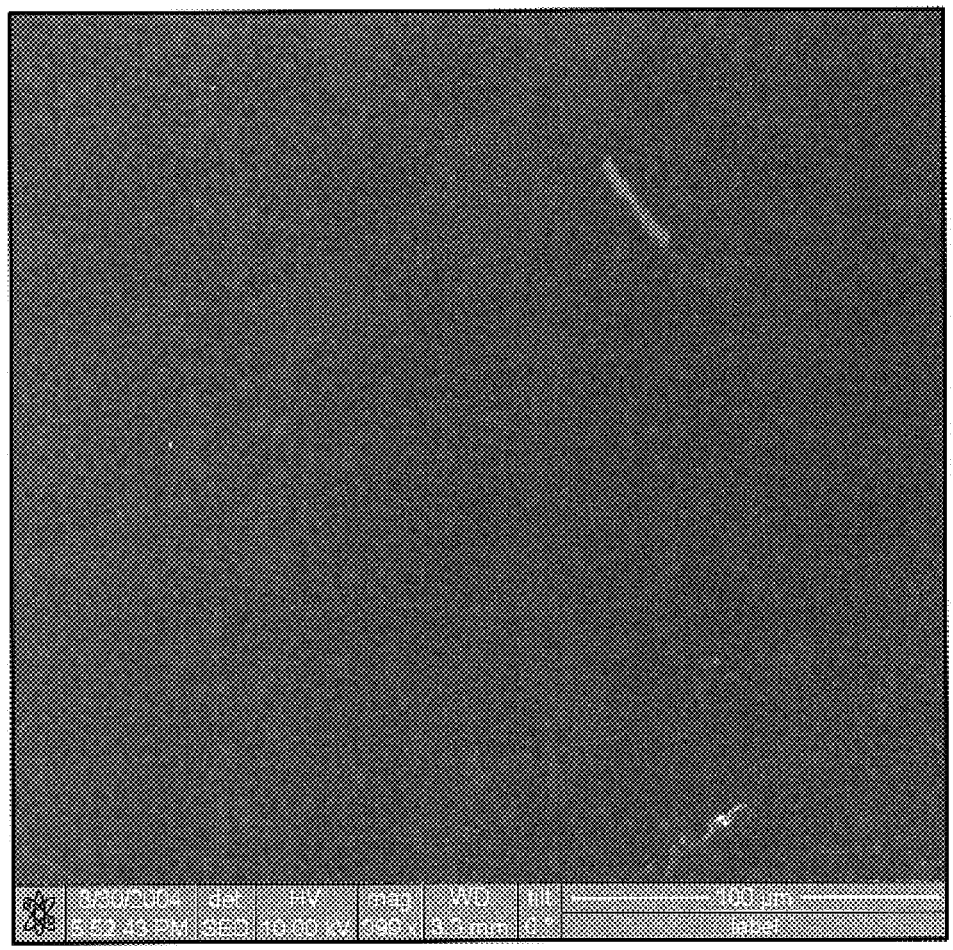
FIG. 11 shows a scanning electron micrograph of an embodiment of a porous Si-containing film.

A Si-containing film was deposited using bis-tertiarybutoxy dibromosilane of the formula (III). The substrate temperature was about 0° C. By-product Br—C(CH$_3$)$_3$ was isolated from the cold trap, indicating that SiO$_x$* was formed and subsequently polymerized to form the Si-containing film (comprising —(SiO$_2$)— recurring units as illustrated in Scheme (A)). A dimethyl oxalate porogen was introduced to the chamber and was present at the substrate during the polymerization of the SiO$_x$*. The resulting porogen-containing Si-containing film was characterized by FTIR soon after deposition (Example 15) and after exposure to air at room temperature for several days (Example 16) as shown in FIG. 10. The FTIR spectra shown in FIG. 10 confirm that both of the films were three-dimensional networks of silicon and oxygen atoms comprising —(SiO$_2$)— recurring units. The FTIR spectra also confirm that the as-deposited film (Example 15) contained the dimethyl oxalate porogen (as indicated by carbonyl bands at about ~1700 cm$^{-1}$) and that the dimethyl oxalate porogen was removed by exposure to air at room temperature for several days (Example 16). Characterization of the air-exposed film (Example 16) by scanning electron microscopy (SEM) as illustrated in FIG. 11 revealed morphology changes consistent with the formation of porosity in the Si-containing film by the removal of the porogen.

Examples 17-19

Figure 12:
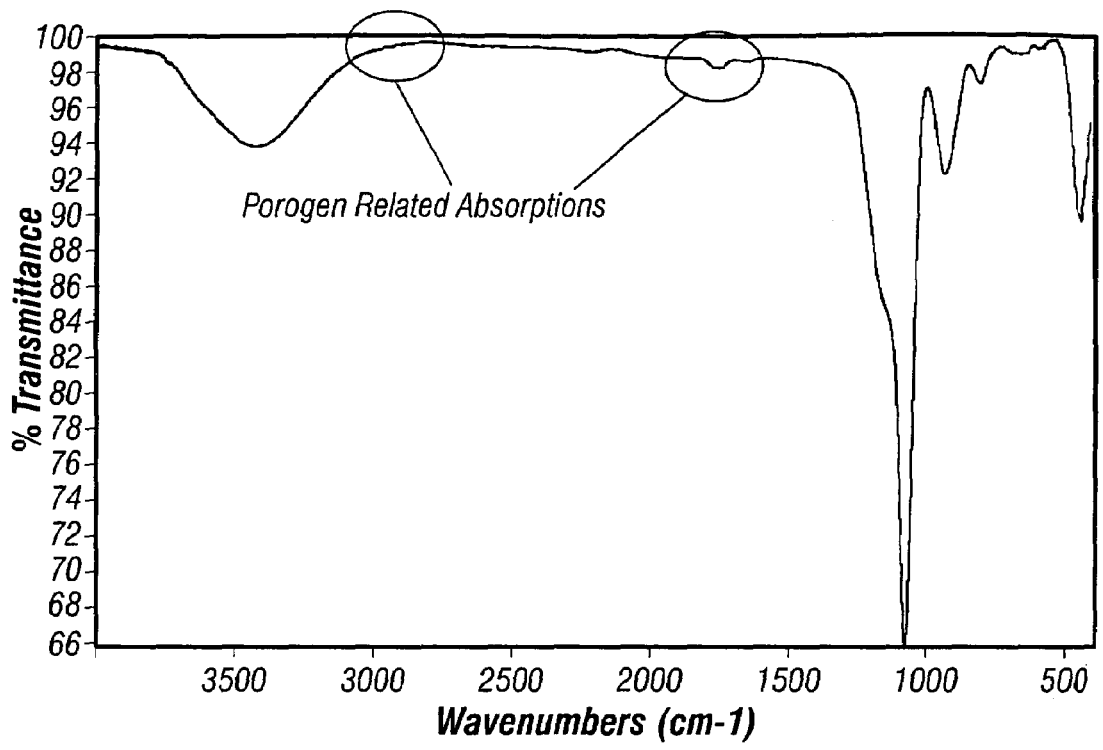
FIG. 12 shows an FTIR spectrum of an embodiment of a porogen-containing Si-containing film.
Figure 13:
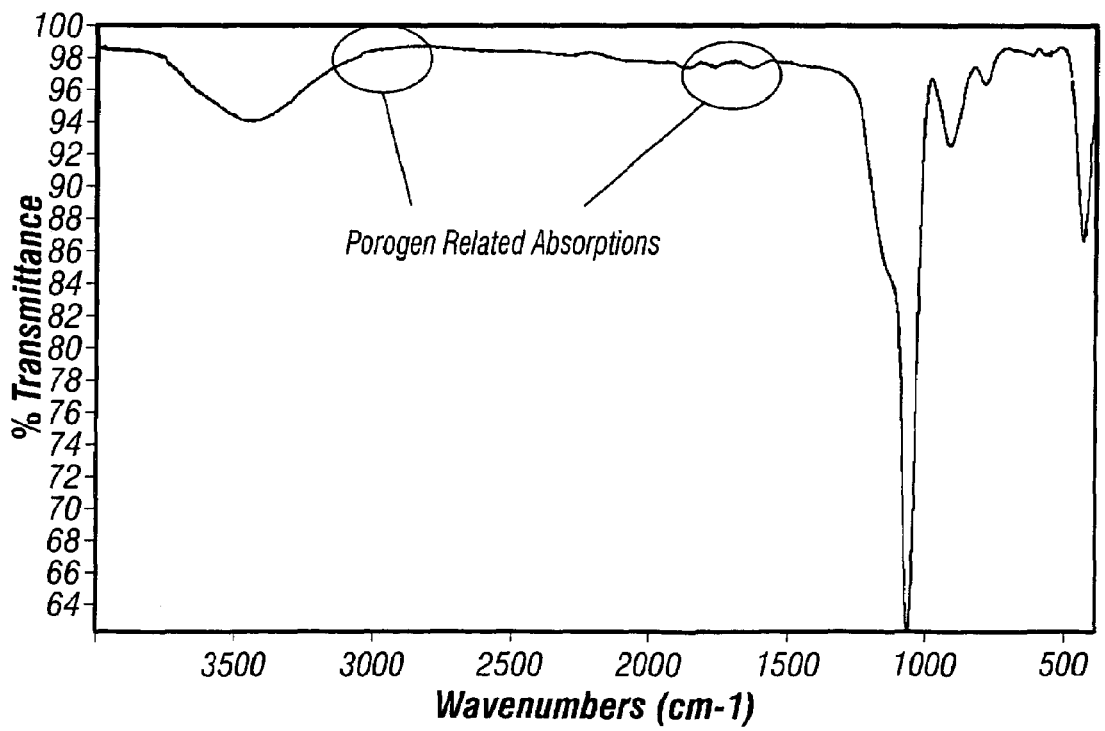
FIG. 13 shows an FTIR spectrum of an embodiment of a porogen-containing Si-containing film.

A Si-containing film was deposited using bis-tertiarybutoxy dibromosilane of the formula (III). The substrate temperature was about 0° C. By-product Br—C(CH$_3$)$_3$ was isolated from the cold trap, indicating that SiO$_x$* was formed and subsequently polymerized to form the Si-containing film (comprising —(SiO$_2$)— recurring units as illustrated in Scheme (A). A di-tertiarybutyl oxalate porogen was introduced to the chamber and was present at the substrate during the polymerization of the SiO$_x$*. The resulting porogen-containing Si-containing film was characterized by FTIR before annealing (Example 17, FIG. 12), after several days exposure to air at room temperature (Example 18, FIG. 13), and after annealing at 425° C. for one hour in air (Example 19, FIG. 14). The FTIR spectra shown in FIGS. 12-14 confirm that all three of the films were three-dimensional networks of silicon and oxygen atoms comprising —(SiO$_2$)— recurring units. The FTIR spectra shown in FIGS. 12-13 also confirm that the as-deposited film (Example 17, FIG. 12) contained the di-tertiarybutyl oxalate porogen (as indicated by carbonyl bands at about ~1700 cm$^{-1}$) and that at least a portion of the di-tertiarybutyl oxalate porogen remained in the film after several days exposure to air at room temperature (Example 18, FIG. 13). The FTIR spectrum shown in FIG. 14 confirms that the porogen was removed by annealing the porogen-containing film at 425° C. for one hour in air. Characterization of the annealed film (Example 19) by SEM reveals morphology changes consistent with the formation of porosity in the Si-containing film by the removal of the porogen.

Examples 20-21

Figure 14:
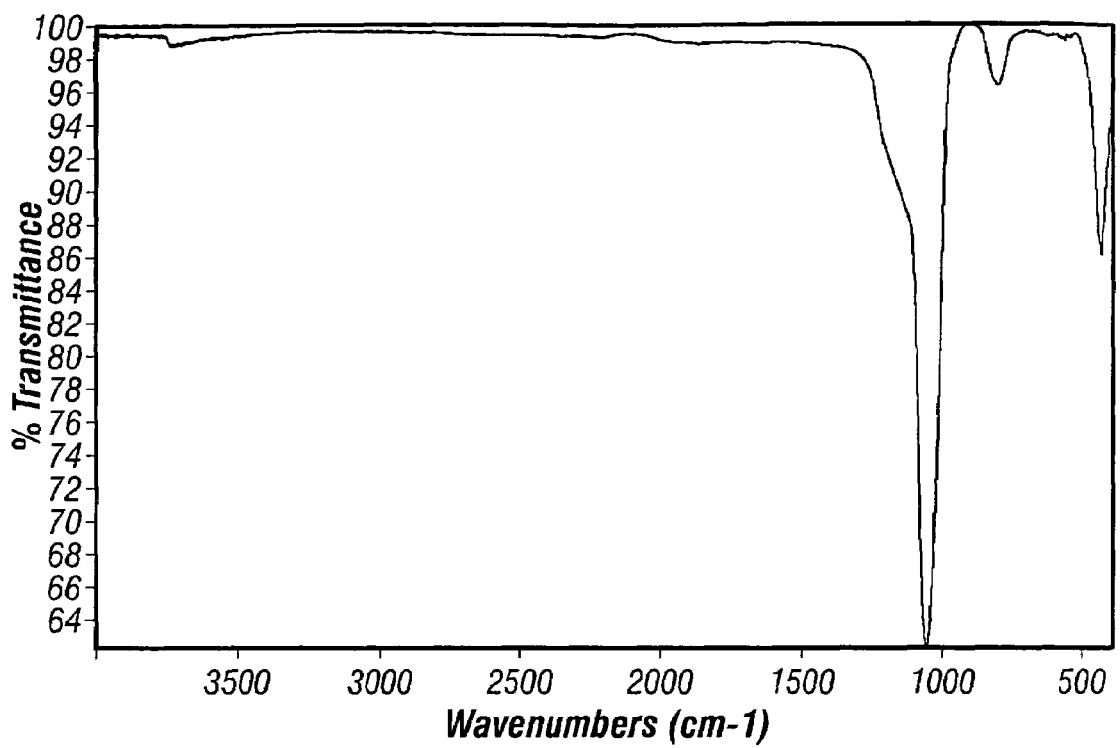
FIG. 14 shows an FTIR spectrum of an embodiment of a porous Si-containing film.
Figure 15:
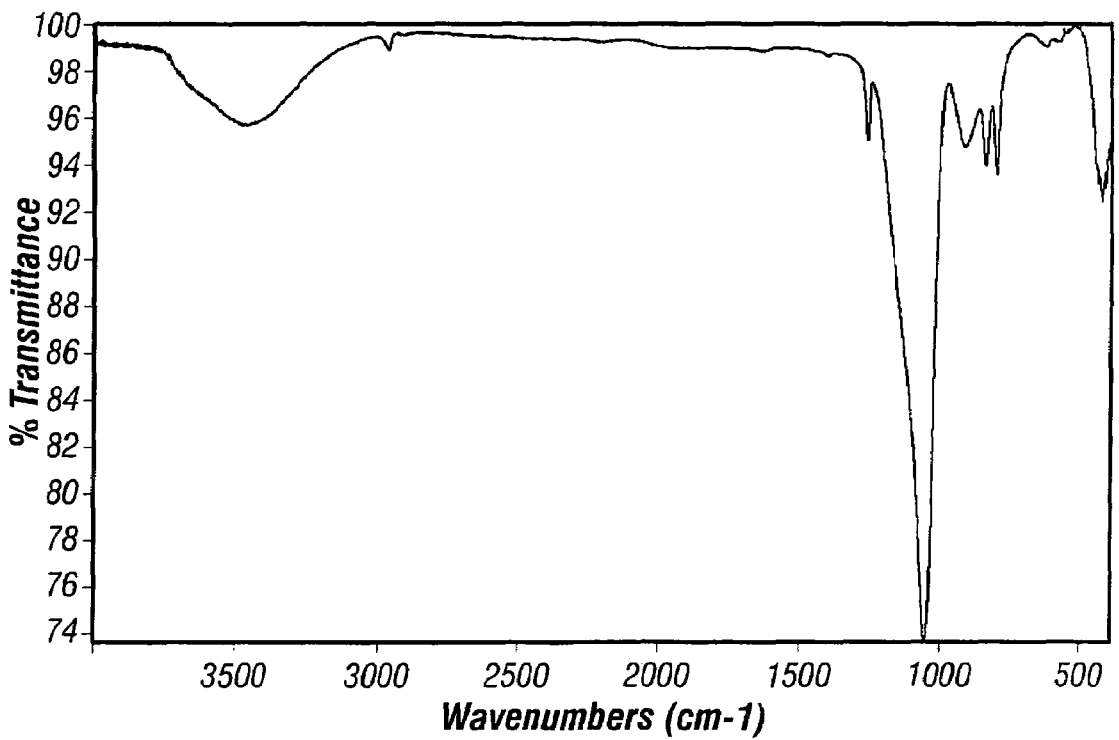
FIG. 15 shows an FTIR spectrum of an embodiment of a Si-containing film.
Figure 16:
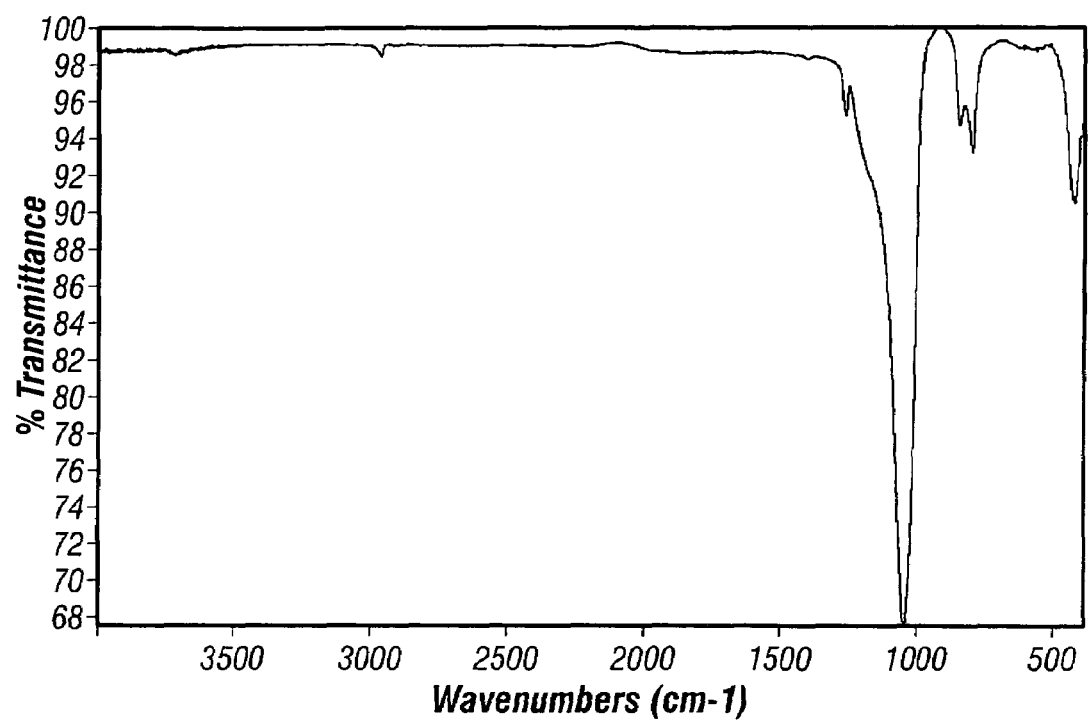
FIG. 16 shows an FTIR spectrum of an embodiment of a Si-containing film.

A Si-containing film was deposited using a mixture of bis-tertiarybutoxy dibromosilane of the formula (III) and tertiarybutoxy-dimethylchlorosilane of the formula Cl(CH$_3$)$_2$SiOC(CH$_3$)$_3$. No porogen was used. The substrate temperature was about 0° C. The as-deposited Si-containing film (Example 20) was characterized by FTIR as shown in FIG. 14. The FTIR spectrum shown in FIG. 14 confirms that the film comprised both —(SiO$_2$)— and —(CH$_3$)$_2$SiO)— recurring units. The as-deposited Si-containing film was annealed in air at 450° C. for one hour (Example 21) and characterized by FTIR as shown in FIG. 15. The FTIR spectrum shown in FIG. 15 confirms that annealing changed the structure of the as-deposited film by reducing the amount of hydroxyl groups.

All patents, patent applications and papers mentioned herein are hereby incorporated by reference in their entireties. It will be appreciated by those skilled in the art that various omissions, additions and modifications may be made to the processes described above without departing from the scope of the invention, and all such modifications and changes are intended to fall within the scope of the invention, as defined by the appended claims.

I claim:

1. A method for forming a film, comprising:
pyrolyzing a vaporized Si precursor in a first zone to thereby form an activated Si-containing intermediate;
transporting the activated Si-containing intermediate to a second zone;
polymerizing the activated Si-containing intermediate in the second zone to thereby form a Si-containing film; and
forming at least one volatile by-product;
the Si precursor being selected from the group consisting of

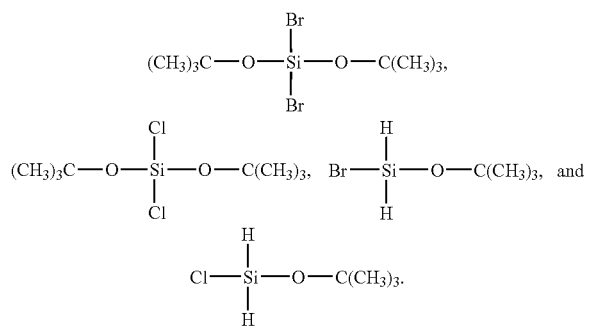

2. The method of claim 1 in which the volatile by-product comprises a compound selected from the group consisting of BrC(CH$_3$)$_3$ and ClC(CH$_3$)$_3$.

3. A method for forming a film, comprising:
pyrolyzing a vaporized Si precursor in a first zone to thereby form an activated Si-containing intermediate;
transporting the activated Si-containing intermediate to a second zone; and
polymerizing the activated Si-containing intermediate in the second zone to thereby form a Si-containing film;
the Si precursor being selected from the group consisting of

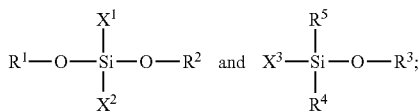

wherein:
$X^1$ and $X^2$ are each individually a halogen, deuterium or H;
$X^3$ is a fluorine;
$R^1$, $R^2$ and $R^3$ are each individually selected from the group consisting of —C(CH$_3$)$_3$, —C$_6$H$_5$, and —NR$^5$R$^6$; and
$R^4$, $R^5$ and $R^6$ are each individually selected from the group consisting of hydrogen, deuterium, optionally fluorinated C$_1$ to C$_6$ alkyl, optionally fluorinated C$_1$ to C$_6$ cycloalkyl, optionally fluorinated C$_1$ to C$_6$ alkoxy, and optionally fluorinated C$_6$ to C$_{10}$ aryl.

4. The method of claim 3 in which the Si-containing film is a crosslinked Si-containing film.

5. The method of claim 3 in which the Si-containing film comprises a recurring unit selected from the group consisting of —SO$_2$—, —Si(R$^4$R$^5$)O—, and —(SiO$_2$)—(Si(R$^4$R$^5$)O)—.

6. The method of claim 3 in which the polymerizing of the activated Si-containing intermediate is conducted in the presence of an oxygen source.

7. The method of claim 6 in which the oxygen source is selected from the group consisting of O$_2$, O$_3$, N2O and mixtures thereof.

8. The method of claim 3 further comprising oxidizing the Si-containing film.

9. The method of claim 3 further comprising annealing the Si-containing film.

10. The method of claim 9 in which at least a part of the annealing is conducted under an inert gas.

11. The method of claim 9 in which at least a part of the annealing is conducted under a gas selected from the group consisting of nitrogen, helium, hydrogen, a nitrogen/helium mixture, and a nitrogen/hydrogen mixture.

12. The method of claim 9 wherein annealing comprises exposing the Si-containing film to an oxygen-containing gas.

13. The method of claim 9 further comprising oxidizing the Si-containing film after the annealing.

14. The method of claim 9 further comprising introducing a porogen to the second zone during the polymerizing of the activated Si-containing intermediate.

15. The method of claim 14 in which the Si-containing film comprises the porogen.

16. The method of claim 15 in which the annealing removes at least a portion of the porogen from the Si-containing film.

17. The method of claim 3 in which a first zone temperature is at least about 25° C. higher than a second zone temperature.

18. The method of claim 3 in which the transporting is conducted through a transport region situated between the first zone and the second zone.

19. The method of claim 18 in which a transport region temperature is higher than a second zone temperature.

20. A method for forming a film, comprising:
transporting a pyrolyzed Si precursor to a substrate;
polymerizing the pyrolyzed Si precursor in the presence of a porogen to form a Si-containing film on the substrate, the Si-containing film comprising a least a portion of the porogen; and
pyrolyzing a Si precursor to form the pyrolyzed Si precursor;
in which the Si precursor is selected from the group consisting of

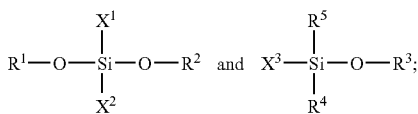

wherein $X^1$, $X^2$, $X^3$, $R^1$, $R^2$ and $R^3$ are each individually leaving groups capable of reacting with one or more of each other to form a volatile by-product;
wherein $R^3$, $R^4$, $R^5$ and $X^3$ are each individually chemical groups selected such that the $R^4$—Si and $R^5$—Si chemical bonds are more stable during the pyrolyzing of the Si precursor than the $X^3$—Si and $R^3$—O bonds; and
in which $R^1$ and $R^2$ are each individually selected from the group consisting of —$C(CH_3)_3$ and —$CF_3$; and in which $X^1$ and $X^2$ are each individually selected from the group consisting of hydrogen, deuterium, fluorine, methyl, and ethyl.

21. The method of claim 20 in which the porogen is selected from the group consisting of optionally halogenated $C_2$-$C_{10}$ alcohol, optionally halogenated $C_2$-$C_{10}$ diol, optionally halogenated $C_2$-$C_{10}$ ether, optionally halogenated $C_2$-$C_{10}$ ketone, optionally halogenated $C_2$-$C_{10}$ ester, optionally halogenated $C_2$-$C_{10}$ aldehyde, optionally halogenated $C_1$-$C_{10}$ hydrocarbon, optionally halogenated $C_2$-$C_{10}$ carboxylic acid, optionally halogenated $C_2$-$C_{10}$ anhydride, carbon monoxide, and carbon dioxide.

22. The method of claim 21 in which the porogen is selected from the group consisting of dimethyl oxalate, di-tertiarybutyl oxalate, carbon tetrabromide, benzene, methanol and t-butanol.

23. The method of claim 20 in which the at least a portion of the porogen is chemically bonded to the Si-containing film.

24. The method of claim 20 in which the at least a portion of the porogen is not chemically bonded to the Si-containing film.

25. The method of claim 20 in which substantially all of the porogen is not chemically bonded to the Si-containing film.

26. The method of claim 20, further comprising heating the Si-containing film to a temperature in the range of about 50° C. to about 600° C.

27. The method of claim 26 in which the heating of the Si-containing film is conducted in the presence of an inert gas.

28. The method of claim 26 in which the heating of the Si-containing film is conducted in the presence of a gas selected from the group consisting of nitrogen, helium, hydrogen, a nitrogen/helium mixture, and a nitrogen/hydrogen mixture.

29. The method of claim 26 in which the heating of the Si-containing film is conducted at a pressure of about 600 Torr or less.

30. The method of claim 26 in which the heating of the Si-containing film is conducted in the presence of an oxygen-containing gas.

31. The method of claim 30 in which the oxygen-containing gas is selected from the group consisting of $O_2$, $O_3$, $N_2O$ and mixtures thereof.

32. The method of claim 26 in which the heating of the Si-containing film removes at least a part of the porogen from the Si-containing film.

33. A method for forming a film, comprising:
transporting a pyrolyzed Si precursor to a substrate;
polymerizing the pyrolyzed Si precursor in the presence of a porogen to form a Si-containing film on the substrate, the Si-containing film comprising a least a portion of the porogen; and
pyrolyzing a Si precursor to form the pyrolyzed Si precursor;
in which the Si precursor is selected from the group consisting of

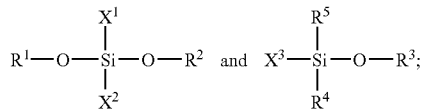

wherein $X^1$, $X^2$, $X^3$, $R^1$, $R^2$ and $R^3$ are each individually leaving groups capable of reacting with one or more of each other to form a volatile by-product;
wherein $R^3$, $R^4$, $R^5$, and $X^3$ are each individually chemical groups selected such that the $R^4$—Si and $R^5$—Si chemical bonds are more stable during the pyrolyzing of the Si precursor than the $X^3$—Si and $R^3$—O bonds; and
in which $X^1$ and $X^2$ are each individually a halogen or H; $X^3$ is a halogen; $R^1$, $R^2$ and $R^3$ are each individually selected from the group consisting of —$C(CH_3)_3$, —$C_6H_5$, and —$NR^5R^6$; and $R^4$, $R^5$ and $R^6$ are each individually selected from the group consisting of hydrogen, deuterium, fluorine, optionally fluorinated $C_1$ to $C_6$ alkyl, optionally fluorinated $C_1$ to $C_6$ cycloalkyl, optionally fluorinated $C_1$ to $C_6$ alkoxy, and optionally fluorinated $C_6$ to $C_{10}$ aryl.

34. A method for forming a porous film, comprising:
transporting a pyrolyzed Si precursor to a substrate;
polymerizing the pyrolyzed Si precursor in the presence of a porogen to form a Si-containing polymer;
depositing the Si-containing polymer and the porogen on the substrate to thereby form a porogen-containing Si-containing film on the substrate; and
removing at least a portion of the porogen from the porogen-containing Si-containing film to thereby form a porous Si-containing film on the substrate, the porous Si-containing film comprising the Si-containing polymer;
in which the Si precursor is selected from the group consisting of

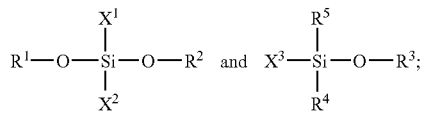

wherein $X^1$, $X^2$, $X^3$, $R^1$, $R^2$ and $R^3$ are each individually leaving groups capable of reacting with one or more of each other to form a volatile by-product;

wherein $R^3$, $R^4$, $R^5$, and $X^3$ are each individually chemical groups selected such that the $R^4$—Si and $R^5$—Si chemical bonds are more stable during the pyrolyzing of the Si precursor than the $X^3$—Si and $R^3$—O bonds; and in which $X^1$ and $X^2$ are each individually a halogen or H; $X^3$ is a halogen; $R^1$, $R^2$ and $R^3$ are each individually selected from the group consisting of —$C(CH_3)_3$, —$C_6H_5$, and —$NR^5R^6$; and $R^4$, $R^5$ and $R^6$ are each individually selected from the group consisting of hydrogen, deuterium, fluorine, optionally fluorinated $C_1$ to $C_6$ alkyl, optionally fluorinated $C_1$ to $C_6$ cycloalkyl, optionally fluorinated $C_1$ to $C_6$ alkoxy, and optionally fluorinated $C_6$ to $C_{10}$ aryl.

35. The method of claim 34 further comprising pyrolyzing a Si precursor to form the pyrolyzed Si precursor.

36. The method of claim 34 in which the porogen is selected from the group consisting of optionally halogenated $C_2$-$C_{10}$ alcohol, optionally halogenated $C_2$-$C_{10}$ diol, optionally halogenated $C_2$-$C_{10}$ ether, optionally halogenated $C_2$-$C_{10}$ ketone, optionally halogenated $C_2$-$C_{10}$ ester, optionally halogenated $C_2$-$C_{10}$ aldehyde, optionally halogenated $C_1$-$C_{10}$ hydrocarbon, optionally halogenated $C_2$-$C_{10}$ carboxylic acid, optionally halogenated $C_2$-$C_{10}$ anhydride, carbon monoxide, and carbon dioxide.

37. The method of claim 34 in which the porogen is selected from the group consisting of dimethyl oxalate, di-tertiarybutyl oxalate, carbon tetrabromide, benzene, methanol and t-butanol.

38. The method of claim 34 in which the porous Si-containing film is a graded porous Si-containing film having a degree of porosity that changes as a function of depth in the film.

39. The method of claim 38 in which the degree of porosity of the graded porous Si-containing film is lower near a surface of the graded porous Si-containing film as compared to the degree of porosity near the center of the graded porous Si-containing film.

40. The method of claim 34, further comprising heating the Si-containing film to a temperature in the range of about 50° C. to about 600° C.

41. The method of claim 40 in which the heating of the Si-containing film is conducted in the presence of an inert gas.

42. The method of claim 40 in which the heating of the Si-containing film is conducted in the presence of a gas selected from the group consisting of nitrogen, helium, hydrogen, a nitrogen/helium mixture, and a nitrogen/hydrogen mixture.

43. The method of claim 40 in which the heating of the Si-containing film is conducted at a pressure of about 600 Torr or less.

44. The method of claim 40 in which the heating of the Si-containing film is conducted at a pressure in the range of about 760 Torr to about 7,600 Torr.

45. The method of claim 40 in which the heating of the Si-containing film is conducted at a pressure that is varied between about 7,600 Torr and about $1 \times 10^{-4}$ Torr during the heating.

46. The method of claim 40 in which the heating of the Si-containing film is conducted in the presence of an oxygen-containing gas.

47. The method of claim 46 in which the oxygen-containing gas is selected from the group consisting of $O_2$, $O_3$, N2O and mixtures thereof.

48. The method of claim 34 in which removing the at least a portion of the porogen from the porogen-containing Si-containing film comprises applying a pressure of about 600 Torr or less to the porogen-containing Si-containing film.

49. A method for forming a porous film, comprising:
transporting a pyrolyzed Si precursor to a substrate;
polymerizing the pyrolyzed Si precursor in the presence of a porogen to form a Si-containing polymer;
depositing the Si-containing polymer and the porogen on the substrate to thereby form a porogen-containing Si-containing film on the substrate; and
removing at least a portion of the porogen from the porogen-containing Si-containing film to thereby form a porous Si-containing film on the substrate, the porous Si-containing film comprising the Si-containing polymer;
in which the porogen comprises di-tertiarybutyl oxalate.

50. The method of claim 34 in which the porous Si-containing film is a graded porous Si-containing film having a degree of porosity that changes as a function of depth in the film.

51. The method of claim 50 in which the degree of porosity of the graded porous Si-containing film is lower near a surface of the graded porous Si-containing film as compared to the degree of porosity near the center of the graded porous Si-containing film.

52. The method of claim 34 in which removing the at least a portion of the porogen from the porogen-containing Si-containing film comprises heating the porogen-containing Si-containing film.

53. The method of claim 52 comprising heating the porogen-containing Si-containing film to a temperature in the range of about 50° C. to about 600° C.

54. The method of claim 52 in which the heating of the porogen-containing Si-containing film is conducted in the presence of an inert gas.

55. The method of claim 52 in which the heating of the porogen-containing Si-containing film is conducted in the presence of a gas selected from the group consisting of nitrogen, helium, hydrogen, a nitrogen/helium mixture, and a nitrogen/hydrogen mixture.

56. The method of claim 52 in which the heating of the porogen-containing Si-containing film is conducted at a pressure of about 600 Torr or less.

57. The method of claim 52 in which the heating of the porogen-containing Si-containing film is conducted at a pressure in the range of about 760 Torr to about 7,600 Torr.

58. The method of claim 52 in which the heating of the porogen-containing Si-containing film is conducted at a pressure that is varied between about 7,600 Torr and about $1 \times 10^{-4}$ Torr during the heating.

59. The method of claim 52 in which the heating of the Si-containing film is conducted in the presence of an oxygen-containing gas.

60. The method of claim 59 in which the oxygen-containing gas is selected from the group consisting of $O_2$, $O_3$, $N_2O$ and mixtures thereof.

61. A method for forming a porous film, comprising:
transporting a pyrolyzed Si precursor to a substrate;
polymerizing the pyrolyzed Si precursor in the presence of a porogen to form a Si-containing polymer;
depositing the Si-containing polymer and the porogen on the substrate to thereby form a porogen-containing Si-containing film on the substrate; and
removing at least a portion of the porogen from the porogen-containing Si-containing film to thereby form a porous Si-containing film on the substrate, the porous Si-containing film comprising the Si-containing polymer: in which the Si precursor is selected from the group consisting of;

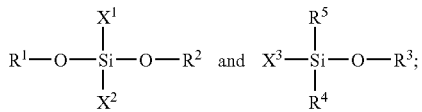

wherein $X^1$, $X^2$, $X^3$, $R^1$, $R^2$ and $R^3$ are each individually leaving groups capable of reacting with one or more of each other to form a volatile by-product;

wherein $R^3$, $R^4$, $R^5$, and $X^3$ are each individually chemical groups selected such that the $R^4$—Si and $R^5$—Si chemical bonds are more stable during the pyrolyzing of the Si precursor than the $X^3$—Si and $R^3$—O bonds; and in which $R^1$ and $R^3$ are each individually selected from the group consisting of —C(CH$_3$)$_3$ and —CF$_3$; and in which $X^1$ and $X^2$ are each individually selected from the group consisting of hydrogen, deuterium, fluorine, methyl, and ethyl.

62. A method for forming a porous film, comprising:

transporting a pyrolyzed Si precursor to a substrate;

polymerizing the pyrolyzed Si precursor in the presence of a porogen to form a Si-containing polymer:

depositing the Si-containing polymer and the porogen on the substrate to thereby form a porogen-containing Si-containing film on the substrate; and removing at least a portion of the porogen from the porogen-containing Si-containing film to thereby form a porous Si-containing film on the substrate, the porous Si-containing film comprising the Si-containing polymer;

in which the porogen comprises di-tertiarybutyl oxalate.

* * * * *